United States Patent [19]

Suzuki et al.

[11] Patent Number: 4,916,996

[45] Date of Patent: Apr. 17, 1990

[54] MUSICAL TONE GENERATING APPARATUS WITH REDUCED DATA STORAGE REQUIREMENTS

[75] Inventors: Hideo Suzuki; Masaki Kudo; Yasushi Kurakake, all of Hamamatsu, Japan

[73] Assignee: Yamaha Corp., Hamamatsu, Japan

[21] Appl. No.: 37,510

[22] Filed: Apr. 13, 1987

[30] Foreign Application Priority Data

| Apr. 15, 1986 | [JP] | Japan | 61-86832 |
| Apr. 15, 1986 | [JP] | Japan | 61-86833 |
| Apr. 15, 1986 | [JP] | Japan | 61-86834 |
| Apr. 15, 1986 | [JP] | Japan | 61-86835 |

[51] Int. Cl.⁴ .................. G10H 1/057; G10H 1/06; G10H 7/00
[52] U.S. Cl. ................... 84/603; 84/605; 84/607; 84/622; 84/627
[58] Field of Search .......... 84/1.01, 1.1, 1.13, 84/1.26, 1.11, 1.19, 1.21, 1.24, 1.28, 602–607, 622–627; 381/29–40, 47, 72, 106; 364/513.5, 723, 853; 333/14; 358/13, 138

[56] References Cited

U.S. PATENT DOCUMENTS

| 4,133,241 | 1/1979 | Niimi | 84/607 |
| 4,383,462 | 5/1983 | Nagai et al. | 84/1.26 |
| 4,518,950 | 5/1985 | Petr | 340/347 |
| 4,520,708 | 6/1984 | Wachi | 84/1.26 |
| 4,633,749 | 1/1987 | Fujimori et al. | 84/1.01 |
| 4,655,114 | 4/1987 | Sunada | 84/1.1 X |
| 4,661,915 | 4/1987 | Ott | 364/513.5 |
| 4,681,008 | 7/1987 | Morikawa et al. | 84/1.01 X |
| 4,696,214 | 9/1987 | Ichiki | 84/1.01 |
| 4,701,872 | 10/1987 | Kitamura et al. | 84/1.01 X |
| 4,722,002 | 1/1988 | Mochizuki et al. | 358/138 X |
| 4,731,847 | 3/1988 | Lybrook et al. | 84/1.01 X |
| 4,781,096 | 1/1988 | Suzuki et al. | 84/1.01 |

FOREIGN PATENT DOCUMENTS

| 59212383 | 8/1986 | Japan . |
| 2066005 | 7/1981 | United Kingdom . |
| 2137399 | 10/1984 | United Kingdom . |

OTHER PUBLICATIONS

Dodge et al., *Computer Music*, MacMillan, Inc., N.Y., 1985, pp. 200–220.

*Primary Examiner*—Stanley J. Witkowski
*Attorney, Agent, or Firm*—Spensley Horn Jubas & Lubitz

[57] ABSTRACT

A musical tone generating apparatus utilizing a data compression method. A musical tone is sampled and is converted into waveform data. These waveform data are compressed into compressed data by a linear predictive coding method and further by a differential quantization method. The number of bits of each of the compressed data is thus significantly smaller than that of the waveform data. Thereafter, a memory stores the thus compressed data corresponding to an attack portion of the tone and a selected part of a sustain portion of the tone. Hence, it is possible to remarkably reduce the memory storage. When generating a musical tone, the memory reads out the compressed data of the attack portion and thereafter repeatedly reads out the compressed data of the selected part. The read-out compressed data are sequentially decoded into the original digital data. Thus, the whole waveform of the musical tone is reproduced.

41 Claims, 18 Drawing Sheets

| | | $S(1)$ | $S(2)$ | $S(3)$ | $S(4)$ |
|---|---|---|---|---|---|
| (A) $S(n)$ | | $S(1)$ | $S(2)$ | $S(3)$ | $S(4)$ |
| (B) $E(n)$ | 0 | $S(1)$ | $S(2) - a_1[S(1) + e_r(1)]$ | $S(3) - a_1[S(2) + e_r(2)] - a_2[S(1) + e_r(1)]$ | $S(4) - a_1[S(3) + e_r(3)] - a_2[S(4) + e_r(2)] + e_r(4)$ |
| (C) $L(n)$ | 0 | $S(1) + e_r(1)$ | $S(2) - a_2[S(1) + e_r(1)] + e_r(2)$ | $S(3) - a_1[S(2) + e_r(2)] - a_2[S(1) + e_r(1)] + e_r(3)$ | $S(4) - a_1[S(3) + e_r(3)] - a_2[S(4) + e_r(3)] + e_r(4)$ |
| (D) 113 | 0 | $S(1) + e_r(1)$ | $S(2) + e_r(2)$ | $S(3) + e_r(3)$ | $S(4) + e_r(4)$ |
| (E) 114a | 0 | 0 | $S(1) + e_r(1)$ | $S(2) + e_r(2)$ | $S(3) + e_r(3)$ |
| (F) 114b | 0 | 0 | 0 | $S(1) + e_r(1)$ | $S(2) + e_r(2)$ |
| (G) $pS(n)$ | 0 | 0 | $a_1[S(1) + e_r(1)]$ | $a_1[S(2) + e_r(2)] + a_2[S(1) + e_r(1)]$ | $a_1[S(3) + e_r(3)] + a_2[S(2) + e_r(2)]$ |
| (H) 302 | | $S(1) + e_r(1)$ | $S(2) - a_1[S(1) + e_r(1)] + e_r(2)$ | $S(3) - a_1[S(2) + e_r(1)] + e_r(3) - a_2[S(1) + e_r(1)] + e_r(3)$ | $S(4) - a_1[S(3) + e_r(3)] - a_2[S(4) + e_r(4)] + e_r(4)$ |
| (I) 130 | 0 | $S(1) + e_r(1)$ | $S(2) + e_r(2)$ | $S(3) + e_r(3)$ | $S(4) + e_r(4)$ |
| (J) 131a | 0 | 0 | $S(1) + e_r(1)$ | $S(2) + e_r(2)$ | $S(3) + e_r(3)$ |
| (K) 131b | 0 | 0 | 0 | $S(1) + e_r(1)$ | $S(2) + e_r(2)$ |
| (L) 131e | 0 | 0 | $a_1[S(1) + e_r(1)]$ | $a_1[S(2) + e_r(2)] + a_2[S(1) + e_r(1)]$ | $a_1[S(3) + e_r(3)] + a_2[S(2) + e_r(2)]$ |

FIG.16

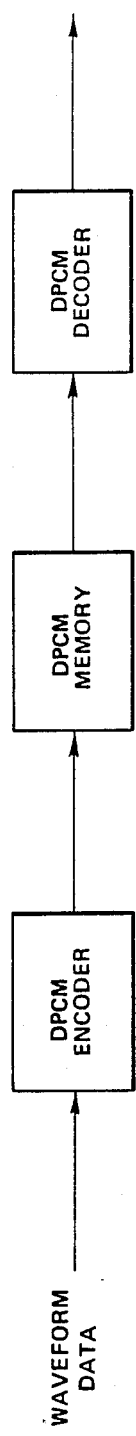
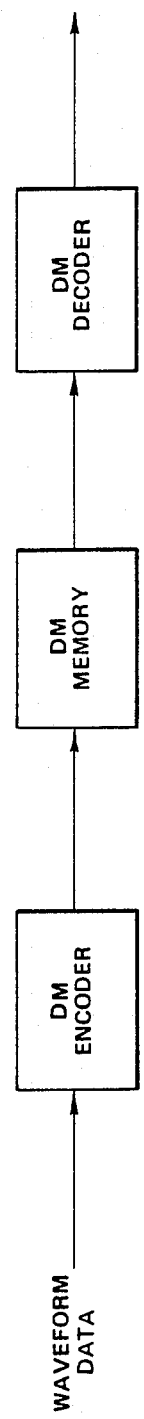
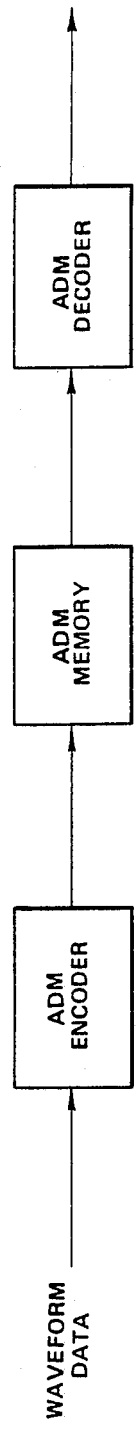

MUSICAL TONE GENERATING APPARATUS WITH REDUCED DATA STORAGE REQUIREMENTS

BACKGROUND OF THE INVENTION

1. Field of the Invention

This invention generally relates to musical tone generating apparatuses for use in electronic musical instruments, and more particularly to a musical tone generating apparatus in which a data compression method is used to reduce the amount of stored data from which tone signals are generated.

2. Prior Art

The electronic musical instruments suffer a big problem that it is hard to generate musical tones which are similar to those of acoustic musical instruments. Various kinds of musical tone signal generating methods are known as for the electronic musical instruments. Among these methods, a PCM (Pulse Code Modulation) method is superior to other methods because the PCM method can generate musical tones which are the most similar to those of the acoustic musical instruments. According to the PCM method, each of instantaneous values of the musical tone waveforms of the acoustic musical instrument are successively sampled and are stored in a memory as sampled digital data. The sampled digital data are read from the memory and are used for generating musical tones. Such PCM method is disclosed, for example, in U.S. Pat. No. 4,383,462 (the title of the invention thereof is "ELECTRONIC MUSICAL INSTRUMENT").

The musical tone waveforms generated by an acoustic musical instrument delicately depend on tone pitches, tone ranges and the like. A piano generates musical tone waveforms which differ by each tone pitch (or each tone range), for example. Of course, periods of such waveforms differ by each tone pitch. Hence, such waveforms must be memorized in the memory for each instrument and for each tone pitch (or each tone range), if necessary in the case where the musical tones truly similar to those of the acoustic musical instruments are to be generated based on the PCM method. For this reason, a scale of a memory storage becomes large. For reducing the amount of data, various kinds of methods, such as a DPCM (Differential Pulse Code Modulation) method, an ADPCM (Adaptive Differential Pulse Code Modulation) method, a DM (Delta Modulation) method, and an ADM (Adaptive Delta Modulation) method, have been proposed. And, the present applicant has disclosed a musical tone generating apparatus in Japanese Patent Application No.59-212382 for reducing the amount of data. In this apparatus, the data are compressed by use of the linear predictive coding and are written into the memory.

On the other hand, the present applicant has disclosed another musical tone generating apparatus in U.S. Pat. No. 4,520,708 for further reducing the amount of data. In this apparatus, the musical tone waveform is divided into an attack portion in which the envelope amplitude of such waveform abruptly increases and a sustain portion in which the envelope amplitude of such waveform is kept approximately constant. And the memory memorizes the attack portion and the selected part of the sustain portion (hereinafter, the selected part of the sustain portion will be referred to as a repeat portion). When the whole waveform must be generated, the attack portion is first read from the memory, and thereafter, the repeat portion is read from the memory repeatedly.

In the case where the compressed data are read from the memory and are decoded into the original data, the value of presently decoded data is obtained by use of the value of precedingly decoded data and the value of present data read from the memory. In this case, the data must be decoded so that the decoded data is continuous and smooth between the attack portion and the repeat portion and between the first repeat portion and the next repeat portion as well. However, there has been proposed no apparatus for realizing a decoding process by which continuous data is reproduced. Hence, the apparatus must memorize the whole waveform of each musical tone and the memory storage becomes large thereby.

SUMMARY OF THE INVENTION

It is therefore a general object of the present invention to provide a musical tone generating apparatus in which sampled digital data can be compressed by use of the linear predictive coding and can be stored in the memory.

It is another object of the present invention to provide such a musical tone generating apparatus in which the amount of stored data of a musical tone signal can be efficiently reduced by storing the attack portion and the selected part of the repeat portion only.

It is a further object of the present invention to provide such a musical tone generating apparatus in which the stored data can be read out and decoded into the original data which is continuous and smooth between the attack portion and the repeat portion and between any adjoining repeat portions as well.

It is a still further object of the present invention to provide such a musical tone generating apparatus which can be suitably applied to an electronic keyboard musical instrument or the like and can obtain musical tones similar to those of the acoustic musical instruments.

According to a first aspect of the present invention, there is provided a musical tone generating apparatus for an electronic musical instrument comprising (a) memory means for storing a series of compressed waveform data therein, said series of compressed waveform data being obtained by compressing a series of waveform data representative of instantaneous values of a waveform of a musical tone by use of a linear predictive coding method and a differential quantization method; (b) reading means for reading said series of compressed waveform data from said memory means; and (c) decoding means for decoding said read series of compressed waveform data by methods corresponding to said linear predictive coding method and said differential quantization method to obtain a series of decoded waveform data, said musical tone being reproduced based on said series of decoded waveform data.

According to a second aspect of the present invention, there is provided a musical tone generating apparatus for an electronic musical instrument comprising (a) first memory means for storing a group of compressed waveform data divided into a plurality of frames which correspond respectively to a plurality of frames of a waveform of a musical tone represented by said group of compressed waveform data, said group of compressed waveform data being obtained by calculating a linear predictive coefficient with respect to each frame of said compressed waveform data group and effecting a linear predictive coding operation on instantaneous values of each frame of said compressed waveform data group using a corresponding one of the calculated linear predictive coefficients; (b) second memory means for storing said calculated linear predictive coefficients; (c) first reading means for reading said group of compressed waveform data from said first memory means; (d) second reading means for reading said calculated linear predictive coefficients in synchronization with said frames of said compressed waveform data group; and (e) decoding means for decoding the read compressed waveform data group, by effecting a decoding operation corresponding to said linear predictive coding operation on each frame of said read compressed waveform data group using a respective one of the read linear predictive coefficients, to thereby obtain a group of decoded waveform data, said musical tone being reproduced from said decoded waveform data.

According to a third aspect of the present invention, there is provided a musical tone generating apparatus for an electronic musical instrument comprising (a) memory means for storing a series of compressed waveform data therein, said series of compressed waveform data being obtained by compressing a series of waveform data representative of instantaneous values of a waveform of a musical tone by use of one of a linear predictive coding method and a modulation method; (b) data providing means for providing data; (c) reading means for repeatedly reading at least one portion of said series of compressed waveform data from said memory means; (d) circuit means responsive to said data provided by said data providing means and said read portion of said compressed waveform data for replacing the first compressed waveform data of said read portion with said data provided by said data providing means to output a group of compressed waveform data; and (e) decoding means for decoding said group of compressed waveform data by a decoding method corresponding to said one method to obtain a series of decoded waveform data, said musical tone being reproduced based on said series of decoded waveform data.

BRIEF DESCRIPTION OF THE DRAWINGS

Further objects and advantages of the present invention will be apparent from the following description, reference being had to the accompanying drawings wherein preferred embodiments of the present invention are clearly shown.

In the drawings:

FIG. 16 is an illustration showing data appearing at various portions of the third embodiment of FIG. 15.

FIGS. 18–20 are block diagrams showing different coding systems usable with the present invention.

DESCRIPTION OF THE PREFERRED EMBODIMENTS OF THE INVENTION

Figure 1:
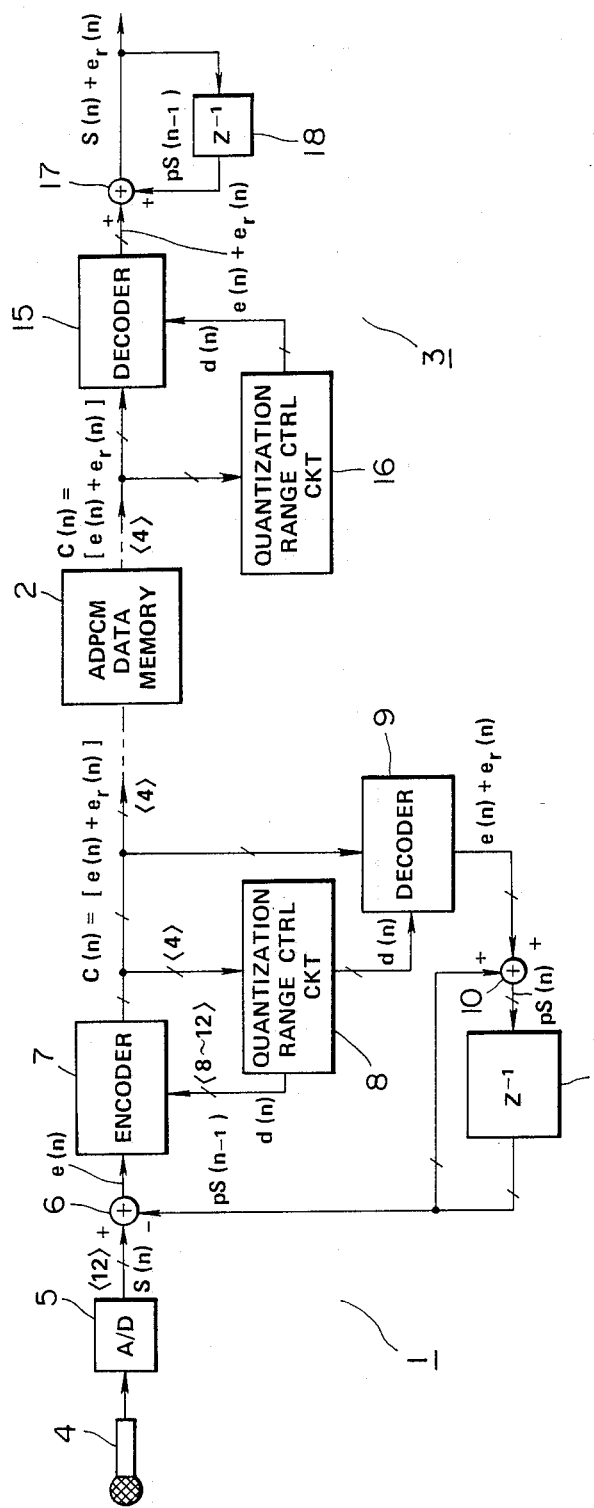
FIG. 1 is a system block diagram showing a fundamental constitution of the present invention.

Referring now to the drawings, wherein like reference characters designate like or corresponding parts throughout the several views.

In this specification, a linear predictive operation is employed as a predictive operation, however, the essential character of the present invention will not be changed whether either one of linear and non-linear predictive operations is employed. The linear predictive operation is convenient because of the simplicity thereof. Hence, the following enbodiments will employ the linear predictive operation.

FIG. 1 shows a system block diagram of a fundamental constitution of a musical tone generating apparatus in accordance with the present invention. In FIG. 1, the apparatus of the present invention can be roughly divided into three parts, namely a data compressing circuit 1, an ADPCM data memory (waveform memory) 2 and a data decoding circuit 3. The ADPCM data memory stores the data compressed in the data compressing circuit 1. The data decoding circuit 3 decodes the data read from the ADPCM data memory 2.

The data compressing circuit 1 comprises a microphone 4, an analog-to-digital (A/D) converter 5, a subtractor 6, an encoder 7, a quantization range control circuit 8, a decoder 9, an adder 10 and a delay flip-flop 11.

A musical tone generated from an acoustic musical instrument (not shown) is collected by the microphone 4 wherein the musical tone is converted into a musical tone signal. The musical tone signal is supplied to the A/D converter 5 wherein the musical tone signal is sampled at a predetermined constant period and is converted into a PCM code $S(n)$ of twelve bits. The subtractor 6 operates as a difference (or a deviation) detecting point which detects a difference between the present PCM code $S(n)$ and a PCM reproduction code pS(n−1) (a generating process of the PCM reproduction code pS(n−1) will be described later) which is identical to a reproduced value of the preceding PCM code S(n−1). The above-mentioned difference is called a difference PCM code e(n) and is supplied to the encoder 7. The encoder 7 quantizes the difference PCM code e(n) based on the ADPCM method to generate a quantized difference code C(n) of four bits (the most significant bit thereof is a sign bit). In this case, the contents of the quantized difference code C(n) correspond to the sum of the difference PCM code e(n) and a quantization error $e_r(n)$. The quantization range control circuit 8 sets an adaptive quantization range data d(n) (of eight bits through twelve bits) for the encoder 7 based on the value of the quantized difference code C(n).

Now, description will be given with respect to a processing operation performed in the quantization range control circuit 8. First, the present quantization range data d(n) is obtained from the preceding quantization range data d(n−1), based on the following formula (1).

$$d(n) = d(n-1) \cdot k \quad (1)$$

Where k denotes a coefficient which is determined by the value of the quantized difference code C(n) as shown in Table 1.

TABLE 1

| C(n) | k |
|---|---|
| 1111 | 2.144 |
| 1110 | 1.772 |
| 1101 | 1.464 |
| 1100 | 1.210 |
| 1011 | 0.909 |
| 1010 | 0.909 |
| 1001 | 0.909 |
| 1000 | 0.909 |
| 0000 | 0.909 |
| 0001 | 0.909 |
| 0010 | 0.909 |
| 0011 | 0.909 |
| 0100 | 1.210 |
| 0101 | 1.464 |
| 0110 | 1.772 |
| 0111 | 2.114 |

In Table 1, the value of the coefficient k increases as an absolute value of the quantized difference code C(n) increases. And, the value of C(n)="1000" corresponds to a decimal value of "0". In the present embodiment, each of the coefficients k of Table 1 is rounded to one decimal place and memorized in a predetermined memory in the quantization range control circuit 8.

Figure 5:
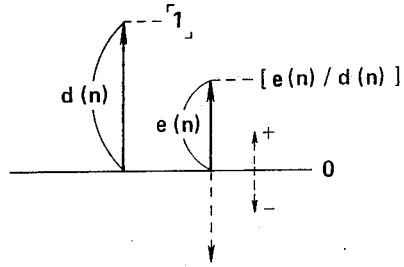
FIG. 5 is an illustration for explaining a principle of a data compression in FIG. 1.
Figure 6:
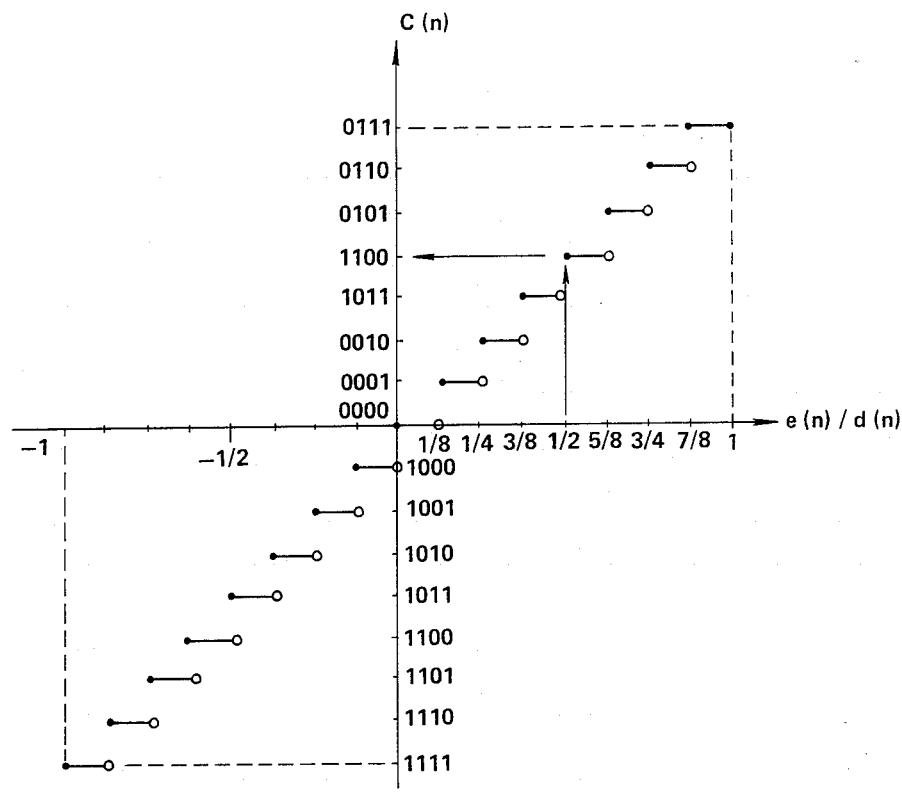
FIG. 6 is a graph showing a relationship among data $e(n)$, a quantization range data $d(n)$ and a quantized difference code $C(n)$.

As shown in FIG. 5, the encoder 7 obtains a relative value e(n)/d(n) of the difference PCM code e(n) where the quantization range data d(n) is set to a value "1". The encoder 7 outputs the value e(n)/d(n) as the quantized difference code C(n). In this case, the value e(n)/d(n) can take any values between values "−1" and "+1". However, since the quantized difference value C(n) is a value of four bits, it is impossible to obtain a linear conversion of e(n)/d(n). Hence, in the present embodiment, an operated result of the value e(n)/d(n) is divided into several sectional values as shown in FIG. 6 and is converted into the quantized difference code C(n) according to the sectional values. For example, when the value e(n)/d(n) is more than ½ or less than ⅝, the quantized difference code C(n) is set to a value "1100" of four bits. Similarly, when the value e(n)/d(n) lies between values "0" and "⅛", the quantized difference code C(n) is set to a value "0000" of four bits.

Now, description will be given with respect to the operation of the decoder 9. The decoder 9 reproduces the difference PCM code e(n) and the quantization error $e_r$ based on the quantized difference code C(n) and the adaptive quantization range d(n). When the quantized difference code C(n) is expressed as $(B_3, B_2, B_1, B_0)$ (where characters $B_0$ through $B_3$ denote respective bits of the code C(n) of four bits), a value $e(n) + e_r(n)$ can be obtained by the following formula (2).

$$e(n) + e_r(n) = (1 - 2 \cdot B_3) \cdot [(d(n)/2) \cdot B_2 + (d(n)/4) \cdot \quad (2)$$
$$B_1 + (d(n)/8) \cdot B_0 + d(n)/8]$$

In above formula (2), an underlined term $(1-2 B_3)$ represents a sign bit. This sign bit is negative where $B_3=$"1" and is positive where $B_3=$"0". The other terms parenthesized by "[ ]" represent an absolute value of $e(n)+e_r(n)$ which is obtained by adding the values d(n) weighed by the respective bits together and further adding an offset value of d(n)/8.

The difference PCM code e(n) from the decoder 9 is passed through the adder (or an addition point) 10 and is supplied to the delay flip-flop 11 where the code e(n) is delayed by one clock period. The delayed code e(n) is fed back to the adder 10 and is also supplied to the subtractor 6. As a result, the adder 10 adds the present difference PCM code e(n) and the previous difference PCM code e(n−1). The output of the adder 10 depends on the differential modulation method and corresponds to a peak value of a signal S(n) which is presently supplied to the subtractor 6. In other words, the above operation is identical to a reproducing operation of the present PCM code. Hence, the output signal of the adder 10 can be expressed as a present PCM reproduction code pS(n), and the output signal of the delay flip-flop 11 can be expressed as the previous PCM reproduction code pS(n−1) (where an initial value pS(O) of the code pS(n) is set to a value "0"). As described heretofore, a circuit constituted by the quantization range control circuit 8, the decoder 9, the adder 10 and the delay flip-flop 11 has a function by which the PCM code S(n−1) at the preceding sampling point is decoded (reproduced). As described before, the previous PCM reproduction code pS(n−1) is supplied to the subtractor 6 where the difference between the present code S(n) and the previous code pS(n−1) is obtained. The subtractor 6 thus performs a difference detection which is a basic process of the differential modulation method.

The above is the constitution and the operation of the data compressing circuit 1, and the quantized difference data C(n) are stored in the ADPCM data memory 2 sequentially.

Next, description will be given with respect to the data decoding circuit 3. In the data decoding circuit 3, a decoder 15, a quantization range control circuit 16, an adder (or an addition point) 17 and a delay flip-flop 18 are similar respectively to the decoder 9, the quantization range control circuit 8, the adder 10 and the delay flip-flop 11. The data decoding circuit 3 decodes the quantized difference code C(n) read from the ADPCM data memory 2 and reproduces the PCM codes S(n) sequentially. The encoder 7 described before is classified into the error feedback type where errors are not accumulated at reproduction. Hence, it is possible to reduce the error component by matching an input-output relationship and an operational accuracy between the encoder 7 and a decoder processing circuit constituted by the quantization range control circuit 8, the decoder 9 and the delay flip-flop 11.

Next, description will be given with respect to a first embodiment of the invention in conjunction with FIGS. 2A and 2B. In FIGS. 2A and 2B, a data compressing circuit 101, a data memory 102 and a decoding circuit 103 correspond respectively to the data compressing circuit 1, the ADPCM data memory 2 and the data decoding circuit 3 in FIG. 1.

Figure 4:
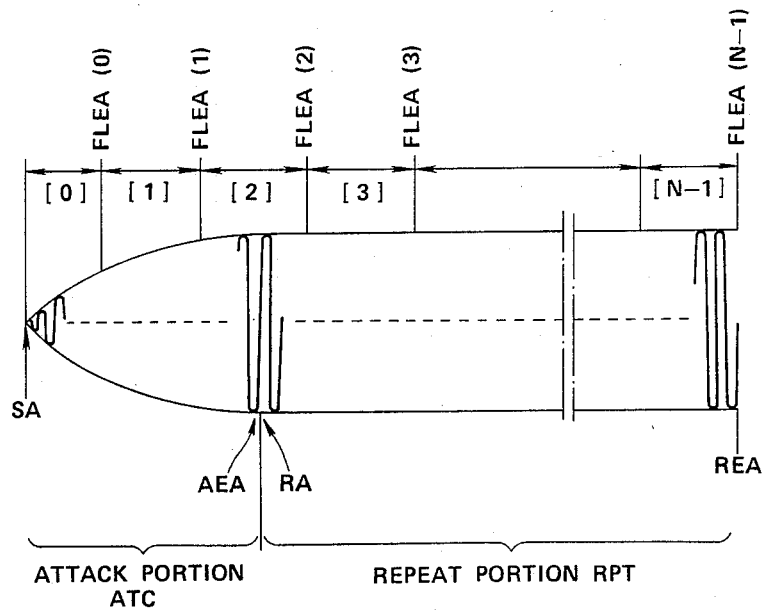
FIG. 4 is an illustration showing an example of a musical tone waveform.

In the data compressing circuit 101, a microphone 104 and an A/D converter 105 correspond respectively to the microphone 4 and the A/D converter 5 in FIG. 1. The digital data (or the sampling data) from the A/D converter 105 are supplied to a waveform processing circuit 106 where the digital data are once stored in a memory provided therein and are standardized by a predetermined standardization process. As shown in FIG. 4, the musical tone signal can be divided into an attack portion (a rising portion) ATC and a repeat portion RPT which is a selected part of the sustain portion. The amplitude of the musical tone signal increases in the attack portion ATC. By the above standardization process, the amplitude of the musical tone signal in the attack portion ATC is rendered identical to that in the repeat portion RPT. Concretely, each of the sampling data of the attack portion ATC is multiplied by a corresponding one of envelope data which change in an inverted manner of an amplitude envelope of the musical tone signal in the attack portion ATC in the standardization process. This standardization process is performed in order to enhance a musical tone reproduction accuracy in a portion in which the amplitude thereof is relatively small. The sampling data outputted from the A/D converter 105 is constituted by twenty four bits, for example. Each standardized sampling data is converted into data of minimum bits (twelve bits, for example) and this data is written into a waveform memory 107 as a waveform data S(n).

When the waveform data S(n) are stored in the waveform memory 107, the waveform memory 107 is connected to a linear predictive coefficient operating circuit 109. The waveform data S(n) are sequentially read from the waveform memory 107 and are supplied to the linear predictive coefficient operating circuit 109 via the switch 108. In the linear predictive coefficient operating circuit 109, optimum linear predictive coefficients $a_1$ and $a_2$ are calculated for each of frames [0]through [N−1]shown in FIG. 4 based on the waveform data S(n) and are written into a coefficient memory 110. As calculation methods of the linear predictive coefficients $a_1$ and $a_2$, various kinds of calculation methods are known conventionally, however, some calculation methods, such as a Durbin method and the like, which use an autocorrelation function, are effective. In addition, it is possible to obtain the coefficients $a_1$ and $a_2$ from a whole waveform data in a frame or from a partial waveform data in a frame.

A linear prediction operating circuit 111 performs a data compression based on the linear predictive coding and is constituted by a subtractor 112, an adding circuit 113 and a prediction value calculating circuit 114. The prediction value calculating circuit 114 is constituted by D-FF (delay flip-flops) 114a and 114b, multipliers 114c and 114d and an adder 114e. The linear predictive coefficients $a_1$ and $a_2$ from the coefficient memory 110 are inputted respectively into the multipliers 114c and 114d as multiplier coefficients thereof. The output data of the adder 114e is supplied to the subtractor 112 as the predictive value pS(n). An ADPCM operating circuit 116 performs a data compression based on an ADPCM quantization method and converts the data E(n) of twelve bits from the subtractor 112 into the quantized difference code C(n) of four bits. The quantized difference code C(n) is stored in the data memory 102. The ADPCM operating circuit 116 also decodes the quantized difference code C(n) into the original data E(n), and the decoded data is supplied to the adder 113. In this case, the decoded data is not identical to the data E(n) because the decoded data includes an error $e_r(n)$. In other words, the decoded data can be expressed as "E(n)+$e_r(n)$".

Next, description will be given with respect to an operation of the linear prediction operating circuit 111. When the linear predictive coefficients $a_1$ and $a_2$ corresponding respectively to the frames [0]through [N−1]are written into the coefficient memory 110, the waveform memory 107 is connected to the subtractor 112 via the switch 108. Thereafter, the waveform data S(n) are read from the waveform memory 107 in a sequence of frames [0], [1], ... and are supplied to the subtractor 112 sequentially. On the other hand, when the waveform data S(n) in the frame [0] are read from the waveform memory 107, the memory 110 reads out the linear predictive coefficients $a_1$ and $a_2$ corresponding to the frame [0]. When the waveform data S(n) in the frame [1] are read from the waveform memory 107, the memory 110 reads out the next linear predictive coefficients $a_1$ and $a_2$ corresponding to the frame [1]. This is true of the other frames. These linear predictive coefficients $a_1$ and $a_2$ are supplied respectively to the multipliers 114c and 114d in a sequence of frames [0], [1], .... In this case, a clock pulse for determining a read-out timing of the waveform memory 107 is identical to a clock pulse supplied to the D-FF 114a and 114b. The subtractor 112 subtracts the prediction value pS(n) from the waveform data S(n), i. e., the subtractor 112 performs an operation according to the following formula (3) to obtain the data E(n).

$$S(n)-pS(n)=E(n) \tag{3}$$

The data E(n) is supplied to the ADPCM operating circuit 116. In this case, the prediction value pS(n) lies in the neighborhood of the waveform data S(n) which is presently supplied to the subtractor 112 (because of a reason which will be described later). As a result, the value of the data E(n) is further smaller than the value of the waveform data S(n). The data E(n) are converted into the quantized difference code C(n) of four bits in the ADPCM operating circuit 116. The ADPCM operating circuit 116 outputs the quantized difference code C(n) to the data memory 102 and also outputs the data "E(n)+$e_r(n)$" to the adder 113. The adder 113 adds the data "E(n)+$e_r(n)$" to the prediction value pS(n) to obtain a sum value. This sum value can be expressed by the following formula (4).

$$E(n)+e_r(n)+pS(n)=S(n)+e_r(n) \tag{4}$$

According to the formula (4), the value of the output data of the adder 113 is approximately identical to the value of the waveform data S(n). Hence, the D-FF 114a memorizes the data in which the value thereof is approximately identical to the value of the preceding waveform data S(n−1) of one clock pulse before. Similarly, the D-FF 114b memorizes the data in which the value thereof is approximately identical to the value of the previous waveform data S(n−2) of two clock pulses before. On the other hand, when the prediction value calculating circuit 114 calculates the prediction value pS(n) by use of the previous waveform data S(n−1) and S(n−2), the linear predictive coefficient operating circuit 109 calculates the coefficients $a_1$ and $a_2$ of such values that the prediction value pS(n) takes the value nearest the present data S(n). These coefficients $a_1$ and $a_2$ are written into the coefficient memory 110. For this reason, the prediction value pS(n) calculated by use of the above coefficients $a_1$ and $a_2$ becomes extremely an approximate value of the waveform data S(n).

Thus, the linear prediction operating circuit 111 converts the waveform data S(n) outputted from the waveform memory 107 into the data E(n) where the value thereof is relatively small. In other words, the circuit 111 compresses the data S(n) and outputs the compressed data to the ADPCM operating circuit 116.

Next, description will be given with respect to the ADPCM operating circuit 116. In the ADPCM operating circuit 116, however, a subtractor 117, an encoder 118, a quantization range control circuit 119, a decoder 120, an adder 121, a delay flip-flop (D-FF) 122 correspond respectively to the subtractor 6, the encoder 7, the quantization range control circuit 8, the decoder 9, the adder 10 and the delay flip-flop 11 in FIG. 1, therefore, detailed description will be omitted.

The subtractor 117 subtracts the prediction data pE(n−1) from the output data E(n) of the subtractor 112. The difference data between data pE(n−1) and E(n) are supplied to the encoder 118 as data e(n) (of twelve bits). The encoder 118 quantizes the data e(n) based on the ADPCM method to obtain the quantized difference code C(n) of four bits (in which the most significant bit thereof is a sign bit). In the quantization range control circuit 119, the adaptive quantization range data d(n) (of eight bits through twelve bits) are set based on the quantized difference code C(n). The decoder 120 produces the data $e(n)+e_r(n)$ by use of the quantized difference code C(n) and the adaptive quantization range data d(n) according to the pre-mentioned formula (2). The output data "$e(n)+e_r(n)$" of the decoder 120 is supplied to the adder 121. The adder 121 adds the data "$e(n)+e_r(n)$" and the prediction data pE(n−1) together to obtain the output data "$E(n)+e_r(n)$" as shown in the following formula (5).

$$e(n)+e_r(n)+pE(n-1)=E(n)+e_r(n) \tag{5}$$

The output data "$E(n)+e_r(n)$" of the adder 121 is delayed by one clock pulse in the D-FF 122 and supplied to the subtractor 117 as the prediction data pE(n−1).

Thus, the value of the prediction data pE(n−1) is approximately equal to the value of the data e(n−1). Hence, the output data e(n) of the subtractor 117 becomes identical to the difference data between the data E(n) and the data E(n−1) (which is the data one clock pulse before the data E(n)). In result, the value of the data e(n) becomes further smaller than the value of the data E(n). Therefore, a big quantization error can not be generated even when the data e(n) are converted into the code C(n) of four bits (substantially three bits) in the encoder 118.

Next, description will be given with respect to the decoding circuit 103 shown in FIG. 2B. The decoding circuit 103 is roughly constituted by an ADPCM decoding circuit 124 and a linear prediction decoding circuit 129. In the result, the quantized difference code C(n) is decoded into data "$S(n)+e_r(n)=H(n)$" in the decoding circuit 103. The ADPCM decoding circuit 124 is constituted by a quantization range control circuit 125, a decoder 126, an adder 127 and a D-FF 128. The quantization range control circuit 125 and the decoder 126 respectively have the same constitutions as the quantization range control circuit 119 and the decoder 120. The output data "$e(n)+e_r(n)$" of the decoder 126 and the data pE(n−1) are added together in the adder 127 and an addition result data "$E(n)+e_r(n)$" is generated. This data "$E(n)+e_r(n)$" is supplied to the D-FF 128 and the linear prediction decoding circuit 129. The above decoding process is identical to that of the ADPCM operating circuit 116 where the data "$E(n)+e_r(n)$" is produced from the quantized difference code C(n).

The linear prediction decoding circuit 129 is constituted by an adder 130 and prediction value calculating circuit 131 where the constitution thereof is identical to that of the pre-mentioned prediction value calculating circuit 114. In this case, the coefficients $a_1$ and $a_2$ read from the coefficient memory 110 are supplied respectively to multipliers 131c and 131d in the circuit 131. The D-FF 131a and 131b are supplied with the clock pulse determining a readout timing of the data memory 102. An adder 131e adds the output data of the multipliers 131c and 131d together and generates the prediction value pS(n) as described before. Therefore, the output data (the decoded data H(n)) of the adder 130 can be expressed by the following formula (6).

$$E(n)+e_r(n)+pS(n)=S(n)+e_r(n)=H(n) \tag{6}$$

The decoded data H(n) will be converted into the musical tone signal by performing a D/A conversion (not shown).

The above is the description of the constitution of the first embodiment of the present invention. In FIGS. 2A and 2B, the quantization error $e_r(n)$ is contained in the output data of each of the adders 121 and 114e, and therefore, the quantization error $e_r(n)$ is also contained in the feedback data, such as the prediction data pE(n) and the prediction value pS(n). In other words, the present embodiment can be classified as the pre-mentioned error feedback type, hence, the error is not accumulated in the decoded data H(n). Generally, a certain error may occur in an operation of finite word length data. In this case, however, it is possible to prevent such errors from being generated by rendering the number of bits of the input and output data equal to that of the operation data between the linear prediction operating circuit 111 and the linear prediction decoding circuit 129 and between the ADPCM operating circuit 116 and the ADPCM decoding circuit 124 as well.

Figure 7:
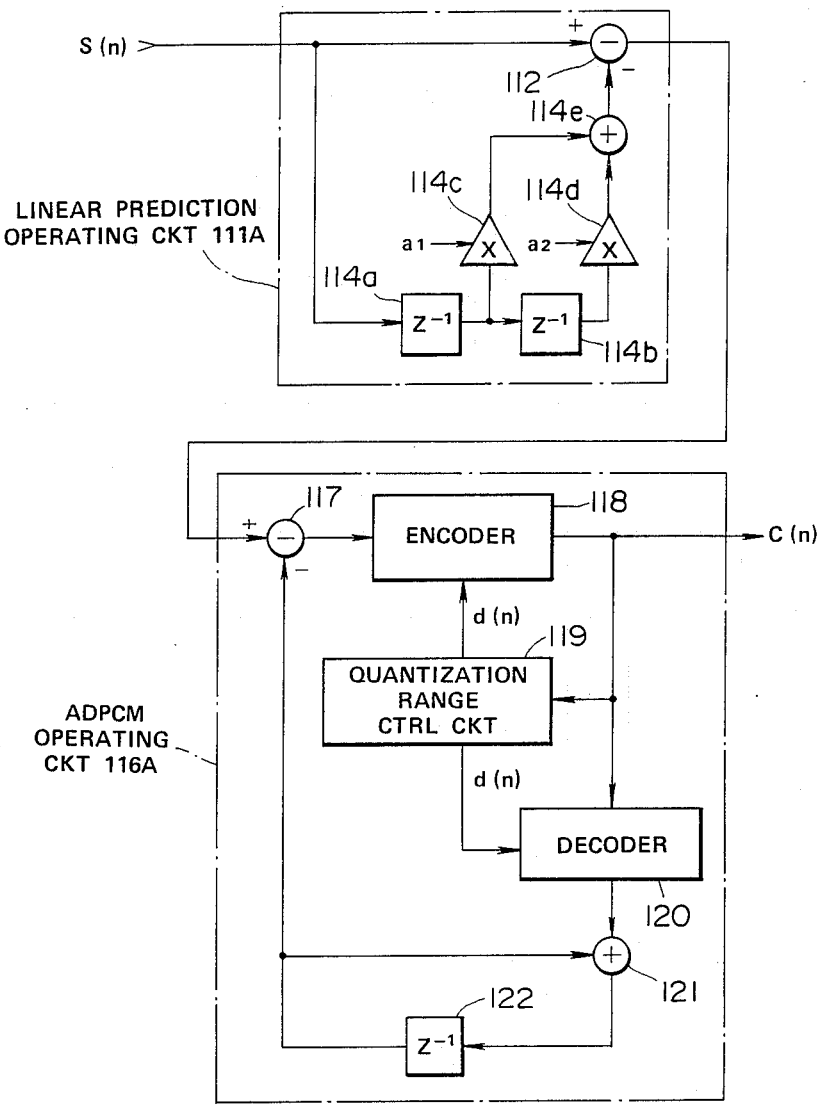
FIG. 7 is a system block diagram showing modified forms of the linear predictive operation circuit and the ADPCM operation circuit shown in FIG. 1.

In the case where the operation is performed very accurately, i. e., in the case where the quantization error is not necessarily considered to be accumulated, it is possible to use operating circuit 111A and 116A shown in FIG. 7 instead of the linear prediction operating circuit 111 and the ADPCM operating circuit 116, respectively.

The data compressing circuit 101 shown in FIG. 2A is not provided in ordinary musical tone generating apparatuses. However, this data compressing circuit 101 is provided in a musical tone generating apparatus which is applied for a sampling electronic musical instrument (in which a player can sample any sounds).

Figure 3A:
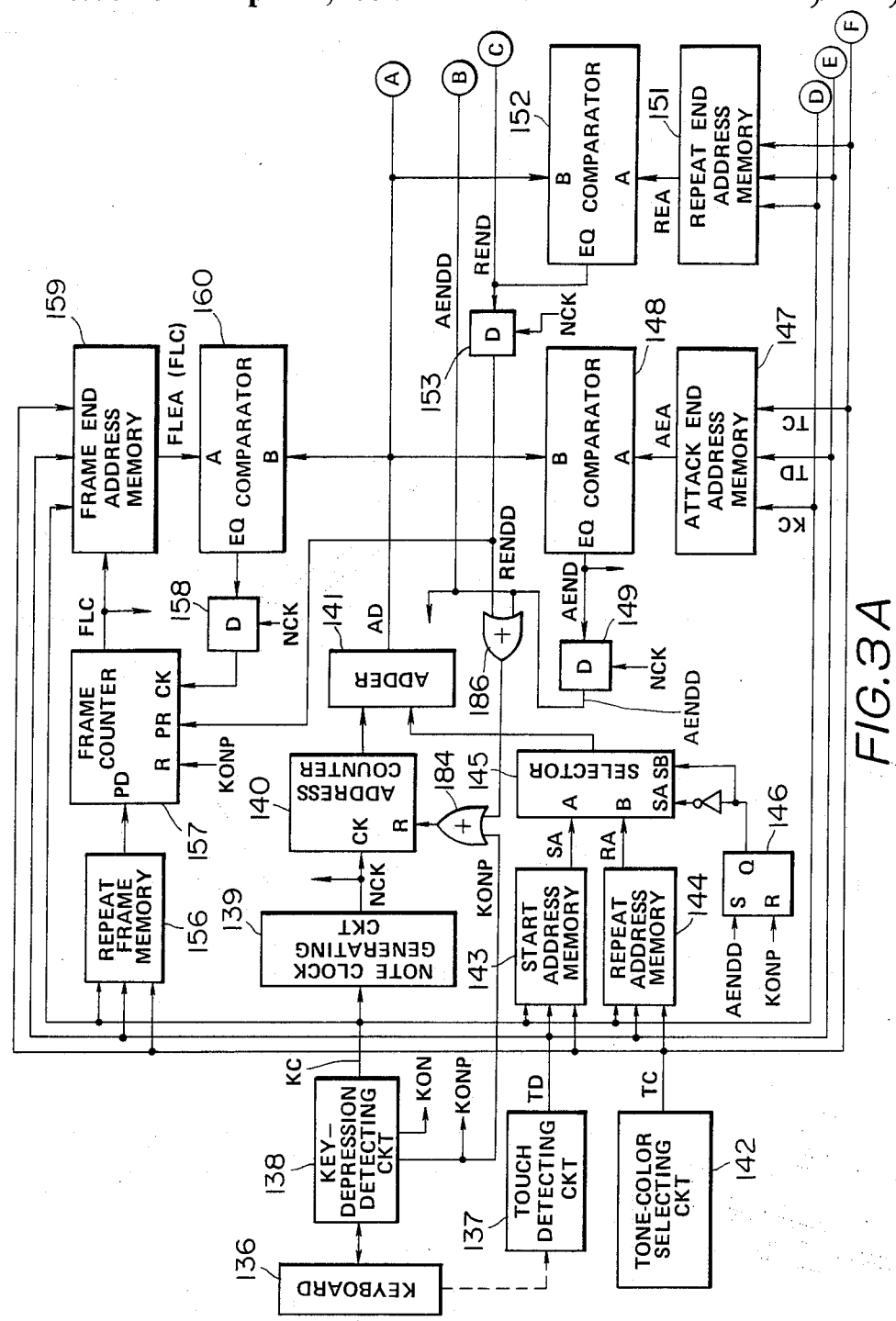
FIGS. 3A and 3B are system block diagrams of an electronic musical instrument to which a second embodiment of the invention is applied.
Figure 3B:
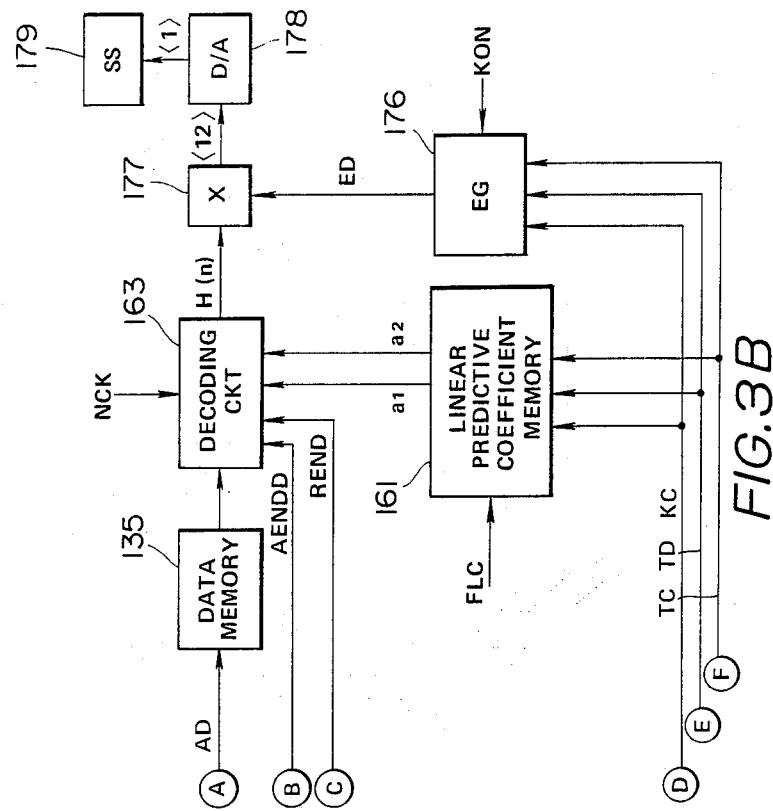

Next, description will be given with respect to the second embodiment of the invention in conjunction with FIGS. 3A and 3B. FIGS. 3A and 3B show system block diagrams of an electronic musical instrument to which the present invention is applied, and description will be firstly given with respect to a musical tone forming method of the electronic musical instrument.

The data representative of musical tone waveforms are standardized and compressed by the data compressing circuit 101 in FIG. 2A and are stored in a data memory 135 in FIG. 3B. The data memory 135 memorizes the musical tone waveform data with respect to each tone color, each touch intensity (each key-depression intensity) and each tone pitch (or each key). For example, when ten kinds of tone colors, forty keys and five levels of the touch intensities are provided, the number of the memorized musical tone waveforms becomes $10 \times 40 \times 5 = 2000$. In this case, the musical tone waveforms memorized in the data memory 135 are not whole waveforms of the musical tone signals but partial waveforms each including the attack portion ATC and a part of the repeat portion RPT which follows the attack portion ATC. Hence, when the musical tone is generated, the waveform of the attack portion ATC is firstly read out and thereafter the waveform of the part of the repeat portion RPT is read out repeatedly to reproduce the whole waveform of the musical tone. This reproduced whole waveform of the musical tone is given an envelope and is converted into a musical tone signal by a D/A conversion.

Hereinafter, detailed description will be given with respect to the second embodiment in conjunction with FIGS. 3A and 3B. In FIG. 3A, when any one of the keys of a keyboard 136 is depressed, a touch detecting circuit 137 detects a touch intensity of the depressed key and generates touch data TD corresponding to the detected touch intensity. For detecting the touch intensity, any of the following first and second methods can be employed. In the first method, two kinds of contacts are provided for each key. The first contact is turned on when the key is slightly depressed, and the second contact is turned on only when the key is depressed down to a bottom point thereof. Then, the touch intensity of the depressed key is detected based on a period between on times of the first and second contacts. On the other hand, in the second method, a piezoelectric-crystal element or other pressure sensitive elements are provided at a bottom portion of each key in order to detect a key-depressing pressure, and the touch intensity of a depressed key is detected based on the output signal of such element. A key-depression detecting circuit 138 detects whether any one of the key is depressed or released based on output signals of key-switches which are provided below the keys of the keyboard 136. When a key is detected to be depressed, a key code KC of the depressed key and a key-on signal KON having a high level "1" (hereinafter, a signal having a high level "1" will be referred to as a "1" signal, and a signal having a low level "0" will be referred to as a "0" signal) are outputted from the key-depression detecting circuit 138. In addition, a key-on pulse KONP is outputted at a leading edge of the key-on signal KON from the key-depression detecting circuit 138. When the key is detected to be released, the level of the key-on signal KON is returned to low level "0" (i. e., the key-on signal KON becomes "0" signal). In the case where a plurality of keys are simultaneously depressed, the above operation is performed on one selected key in the depressed keys (such as a last depressed key or a key having the highest-pitch tone in the depressed keys, for example). A note clock NCK is generated in a note clock generating circuit 139 and is supplied to various portions of this instrument. This note clock NCK has a frequency corresponding to the tone pitch of the key which is indicated by the key code KC outputted from the key-depression detecting circuit 138. An address counter 140 counts up the note clock NCK and outputs a counted value thereof to an adder 141.

A tone-color selecting circuit 142 is constituted by a plurality of tone-color selection operating elements and attached circuits thereof, and the tone-color selecting circuit 142 outputs a tone code TC corresponding to a presently selected tone color. A start address memory 143 memorizes address data which indicate addresses of head data of the musical tone waveforms stored in the data memory 135 shown in FIG. 3B. When the key code KC, the tone code TC and the touch data TD are supplied to the start address memory 143, the memory 143 reads out and outputs the start address data SA indicating the head address of the musical tone waveform corresponding to the above supplied data. A repeat address memory 144 memorizes address data indicating addresses of repeat data of the musical tone waveforms stored in the data memory 135. The repeat data is the head data of the repeat portion RPT shown in FIG. 4. When the key code KC, the tone code TC and the touch data TD are supplied to the repeat address memory 144, the memory 144 reads out and outputs repeat address data RA indicating the address storing the repeat data of the musical tone waveform corresponding to the above supplied data. One of the start address data SA and the repeat address data RA is selected by a selector 145 and is supplied to the adder 141. An R-S flip-flop (reset-set flip-flop) 146 is provided for controlling the selector 145. When the "0" signal is outputted from the output terminal Q of the flip-flop 146, an input terminal A of the selector 145 is selected and the start address data SA is outputted to the adder 141. When the "1" signal is outputted from the output terminal Q of the flip-flop 146, an input terminal B of the selector 145 is selected and the repeat address data RA is outputted to the adder 141. Two output data of the address counter 140 and the selector 145 are added together in the adder 141, and the sum data of the above two output data is supplied to the data memory 135 shown in FIG. 3B as address data AD.

An attack end address memory 147 memorizes address data indicating addresses of attack portion end data of the musical tone waveforms stored in the data memory 135. The attack portion end data is the last data of the attack portion ATC shown in FIG. 4. When the key code KC, the tone code TC and the touch data TD are supplied to the attack end address memory 147, the memory 147 reads out and outputs attack end address data AEA to a comparator 148. This data AEA indicate the address storing the attack portion end data of the musical tone waveform corresponding to the above supplied data. The comparator 148 compares the address data outputted from the adder 141 with the attack end address data AEA. When the data AD and AEA become equal to each other, the comparator 148 outputs an attack end signal AEND ("1" signal). A D-FF (a delay flip-flop) 149 is provided for adjusting the timing. The attack end signal AEND is delayed by one clock of the note clock NCK in the D-FF 149 and is outputted as a signal AENDD. A repeat end address memory 151 memorizes address data indicating addresses storing repeat portion end data of the musical tone waveforms in the data memory 135. The repeat portion end data is the last data of the repeat portion RPT shown in FIG. 4. When the key code KC, the tone code TC and the touch data TD are supplied to the repeat end address memory 151, repeat end address data REA is read from the memory 151 and is supplied to a comparator 152. This repeat end address data REA indicates the address storing the repeat portion end data of the musical tone waveform corresponding to the above supplied data. The comparator 152 compares the address data AD outputted from the adder 141 with the repeat end address data REA. When both of the data AD and the data REA become equal to each other, the comparator 152 outputs a repeat end signal REND ("1" signal). A D-FF 153 is provided for adjusting the timing. The repeat end signal REND is delayed by one clock of the note clock NCK and is outputted as a signal RENDD. A repeat frame memory 156 shown in an upper portion of FIG. 3A memorizes the number of the frame to which the repeat data (i. e., the head data of the repeat portion RPT) belongs, in correspondence with each musical tone waveform. In FIG. 4, the repeat data belongs to the frame [2], and the frame number for the repeat data is determined in correspondence with each musical tone waveform. The repeat frame memory 156 memorizes the frame number for the repeat data in correspondence with each musical tone waveform. When the key code KC, the tone code TC and the touch data TD are supplied to the repeat frame memory 156, the frame number is read out in correspondence with the above supplied data and is outputted to a terminal PD for preset data in a frame counter 157. The frame counter 157 is provided for outputting the frame number of the presently generating musical tones. The frame counter 157 is reset by the key-on pulse KONP so that the output data of the repeat frame memory 156 is preset by the signal RENDD, and the frame memory 157 counts up the output signal of a D-FF 158 to obtain a frame code FLC. The frame code FLC is supplied to a frame end address memory 159 and a linear predictive coefficient memory 161 shown in FIG. 3B as well. The frame end address memory 159 memorizes address data indicating addresses of the last waveform data of the frames [0] through [N−1] in correspondence with each musical tone waveform. When the key code KC, the tone code TC and the touch data TD are supplied to the memory 159, an area storing N kinds of address data is appointed. The address data in the area are read out based on the frame code FLC outputted from the frame counter 157 and are outputted to a comparator 160 as the frame end address data FLEA (FLC). The comparator 160 compares the address data AD outputted from the adder 141 with the frame end address data FLEA(FLC). When both of the data AD and the data FLEA(FLC) become equal to each other, the comparator 160 outputs the "1" signal. A D-FF 158 is provided for adjusting the timing. The output signal of the comparator 160 is delayed by one clock of the note clock NCK and is outputted to a clock terminal CK of the frame counter 157.

In FIG. 3B, a linear predictive coefficient memory 161 provides storing areas corresponding to the musical tone waveform in the data memory 135 and memorizes N pairs of linear predictive coefficients $a_1$ and $a_2$ corresponding to the frames [0] through [N−1] into each of the storing areas. When the key code KC, the tone code TC and the touch data TD are supplied to the linear predictive coefficient memory 161, a storing area is selected in correspondence with the above supplied data. And the linear predictive coefficients $a_1$ and $a_2$ stored in the selected storing area are read from the memory 161 based on a frame code FLC outputted from the frame counter 157.

Figure 8A:
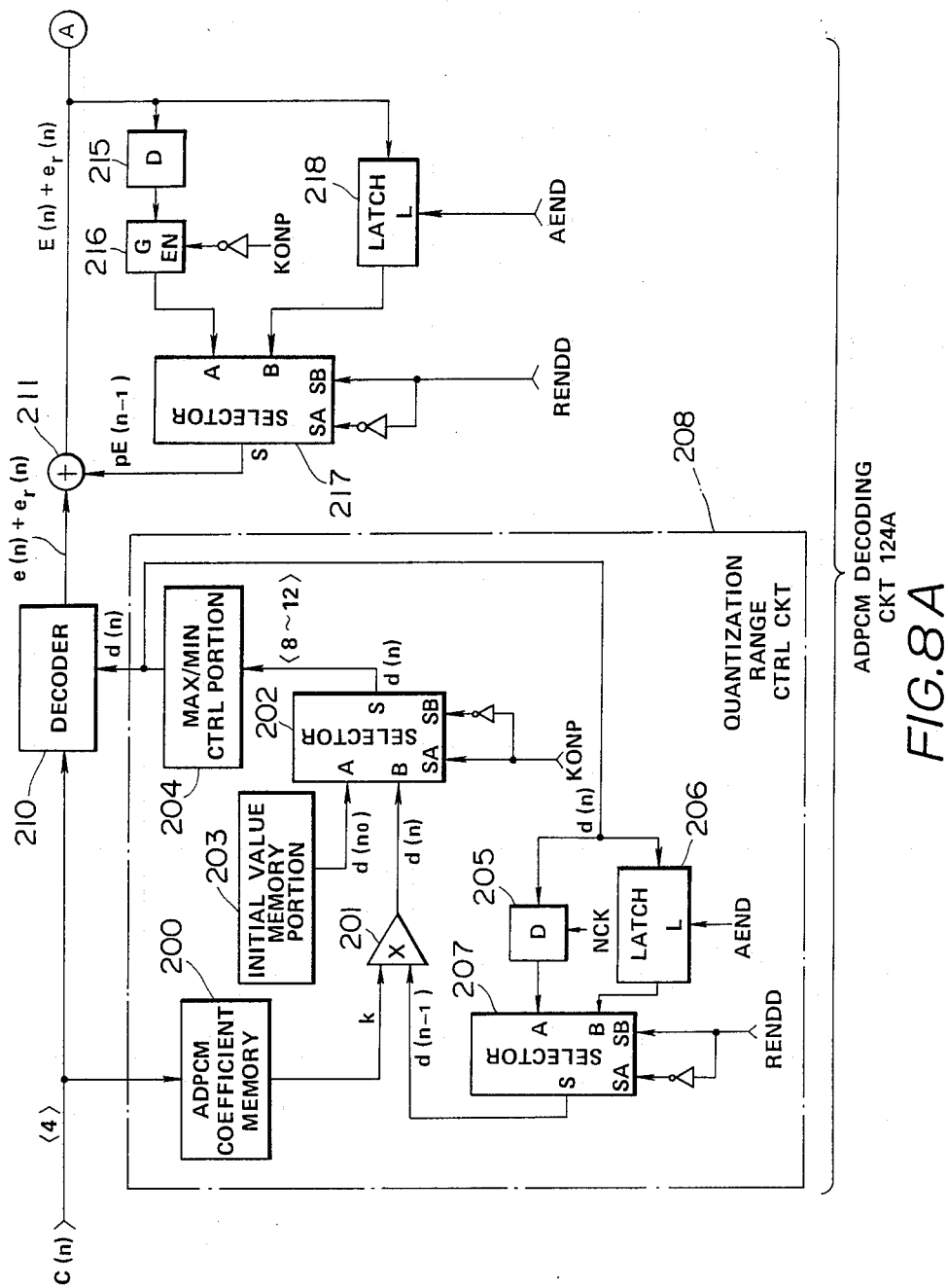
FIGS. 8A and 8B are system block diagrams showing a detailed constitution of a decoding circuit shown in FIG. 2.
Figure 8B:
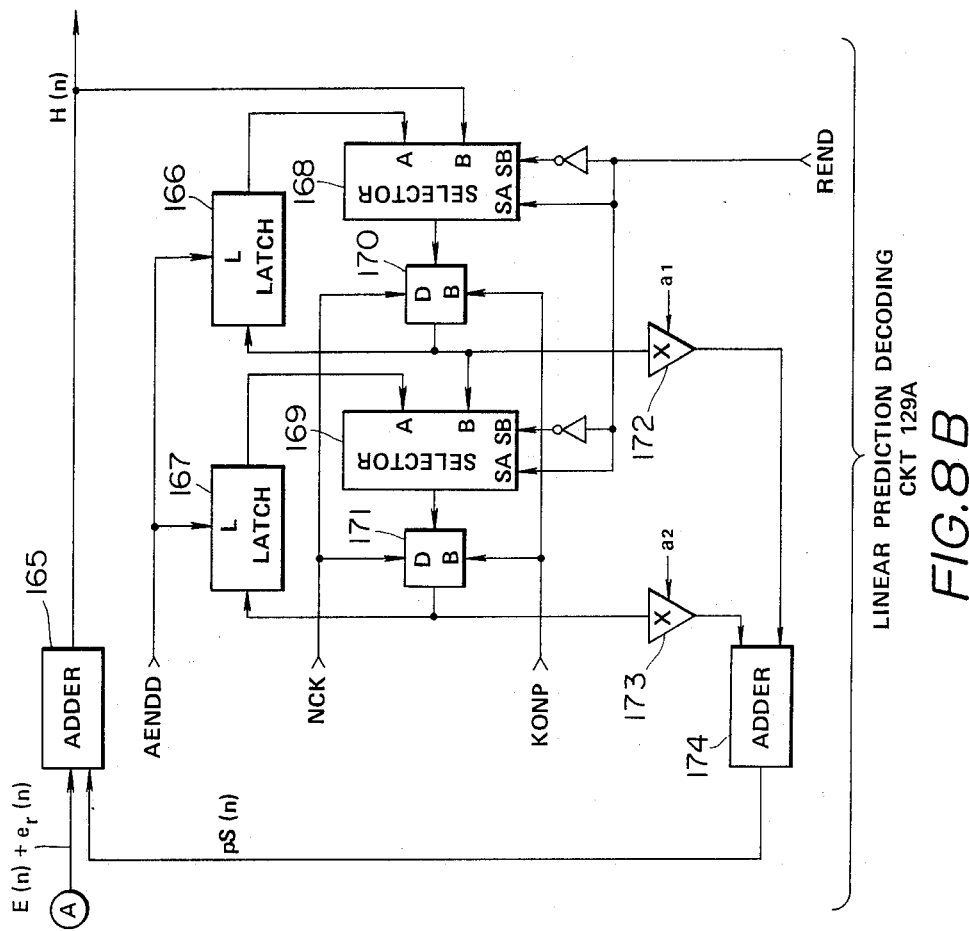

A decoding circuit 163 decodes the quantized difference code C(n) outputted from the data memory 135 into the decoded data H(n) and a detailed constitution thereof is shown in FIGS. 8A and 8B. The constitution of the decoding circuit 163 is basically similar to that of the decoding circuit 103 shown in FIG. 2B, and the decoding circuit 163 is constituted by an ADPCM decoding circuit 124A shown in FIG. 8A and a linear prediction decoding circuit 129A shown in FIG. 8B. In the ADPCM decoding circuit 124A, an ADPCM coefficient memory 200 memorizes conversion data as described in Table 1 and outputs a coefficient k in correspondence with the value of the quantized difference code C(n).

The coefficient k outputted from the ADPCM coefficient memory 200 is supplied to one input terminal of a multiplier 201 where the coefficient k is multiplied by the previous quantization range data d(n−1). In the multiplier 201, the present quantization range data d(n) is calculated according to the pre-mentioned formula (1) and is supplied to an input terminal B of a selector 202. The selector 202 selects the input terminal A when the "1" signal is supplied to the terminal SA, and the selector 202 selects the input terminal B when the "1" signal is supplied to the terminal SB. In other words, the selector 202 usually selects the input terminal B but selects the input terminal A when the key-on pulse KONP is outputted. An initial value memory portion 203 memorizes an initial value $d(n_0)$ of the quantization range data d(n) and supplies the initial value $d(n_0)$ to the input terminal A of the selector 202. The output signal ( d(n) or $d(n_0)$ ) of the selector 202 is supplied to a decoder 210, a delay flip-flop 205 and a latch circuit 206 via a max/min control portion 204. The max/min control portion 204 regulates a maximum value and a minimum value of the quantization range data d(n). For example, the maximum value and the minimum value of the quantization range data d(n) are set respectively to decimal values 16 and 1552. And, when the value of the quantization range data d(n) exceeds the maximum value or the minimum value, the maximum value or the minimum value must be outputted from the max/min control portion 204. A delay flip-flop 205 delays the quantization range data d(n) by one clock of the note clock NCK. When the attack end signal AEND is supplied to the latch circuit 206, the latch circuit 206 inputs and latches the quantization range data d(n) supplied to an input terminal thereof. The output data of the delay flip-flop 205 and the latch circuit 206 are supplied respectively to input terminals A and B of a selector 207. When the "1" signal is supplied to a terminal SA of the selector 207, the selector 207 selects the input terminal A. When the "1" signal is supplied to a terminal SB of the selector 207, the selector 207 selects the input terminal B. Thereafter, the selector 207 usually selects the input terminal A thereof, however, the selector 207 selects the input terminal B thereof when the signal RENDD is supplied to the selector 207. In this case, when the selector 207 selects the input terminal A thereof, the selector 207 outputs the quantization range data d(n−1) delayed by one clock in the delay flip-flop 205 from an output terminal S thereof. When the selector 207 selects the input terminal B thereof, the selector 207 outputs the data from the latch circuit 206 (this operation will be described later).

Figure 2:
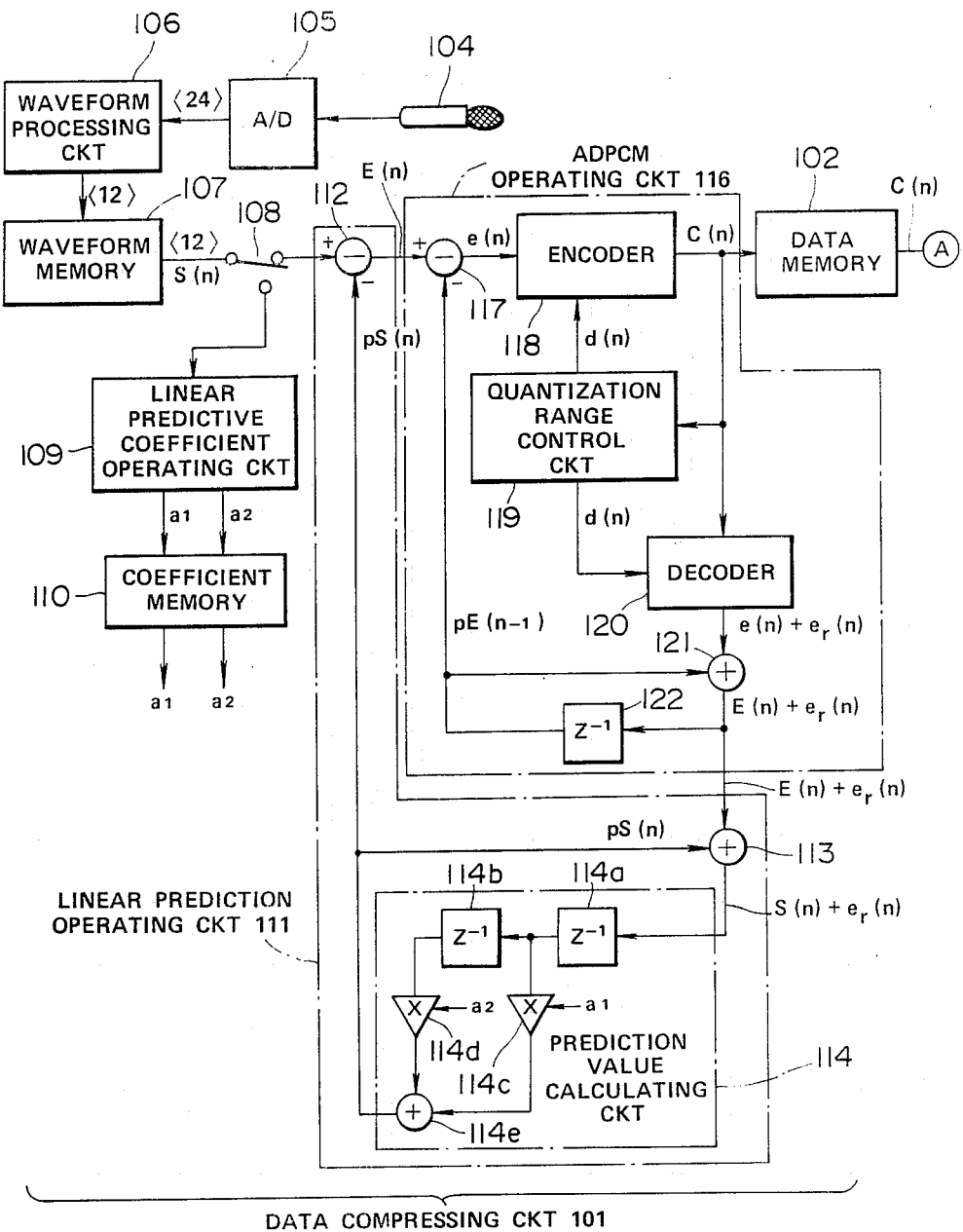
FIGS. 2A and 2B are system block diagrams of a first embodiment of the invention.
Figure 2B:
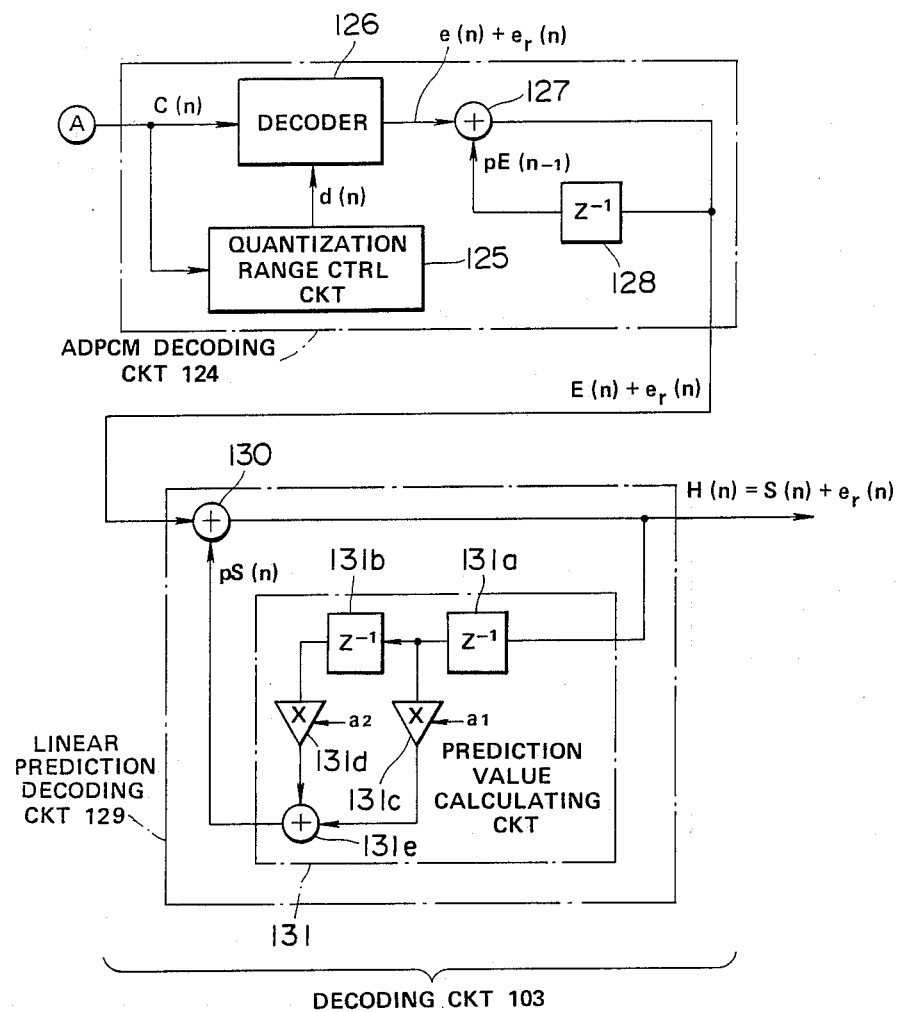

As same as the decoders 120 and 126 in FIGS. 2A and 2B, a decoder 210 carries out a calculation according to the pre-mentioned formula (2) and outputs the data "$e(n)+e_r(n)$". An adder 211 adds the data "$e(n)+e_r(n)$" from the decoder 210 to the prediction data $pE(n-1)$ from the selector 217 to obtain sum data "$E(n)+e_r(n)$". This sum data "$E(n)+e_r(n)$" is outputted to an adder 165 within the linear prediction decoding circuit 129A. A D-FF 215 is similar to the D-FF 128 shown in FIG. 2. The data supplied to an input terminal of the D-FF 215 is delayed by one clock of the note clock NCK and is outputted to a gate 216. The gate 216 is opened under a condition in which the key-on pulse KONP is not supplied. The opened gate 216 supplies the output signal of the D-FF 215 to an input terminal A of the selector 217. When the attack end signal AEND is supplied to a latch circuit 218, the latch circuit 218 inputs and latches the data supplied to an input terminal thereof. The output signal of the latch circuit 218 is supplied to an input terminal B of the selector 217. The selector 217 usually selects the input terminal A thereof, however, the selector 217 selects the input terminal B thereof when the signal RENDD is supplied to the selector 217. In the case where the selector 217 selects the input terminal A thereof, the data "$E(n)+e_r(n)$" delayed by one clock in the D-FF 215 is outputted from the output terminal of the selector 217. In the case where the selector 217 selects the input terminal B, the selector 217 outputs the data supplied from the latch circuit 218 (this operation will be described later).

Next, description will be given with respect to the linear prediction decoding circuit 129A shown in FIG. 8B. The adder 165 adds the data "$E(n)+e_r(n)$" supplied to one input terminal thereof to the prediction value $pS(n)$ supplied to the other input terminal thereof to obtain the data $H(n)$. Latch circuit 166 and 167 respectively read in the data supplied to input terminals thereof when the signal AENDD is supplied to both of load terminals L of the latch circuits 166 and 167. Both of selectors 168 and 169 select and output the data supplied to the input terminals A when the repeat end signal REND is "1" signal. On the other hand, both of the selectors 168 and 169 select and output the data supplied to the input terminals B when the repeat end signal REND is "0" signal. Both of D-FF 170 and 171 read in input data thereof when the note clock signal NCK is supplied to the D-FF 170 and 171, and the D-FF 170 and 171 are reset by the key-on pulse KONP. Multipliers 172 and 173 respectively use the linear predictive coefficients $a_1$ and $a_2$ as multiplier coefficients thereof. An adder 174 adds output data of the multipliers 172 and 173 together to obtain the prediction data $pS(n)$.

Figure 9:
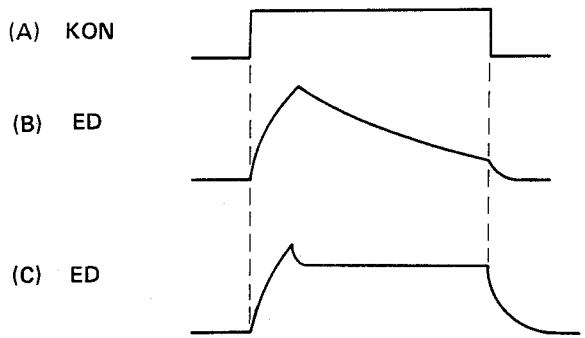
FIG. 9 shows envelope waveforms of signals used in FIG. 2.

Now, description will be given with respect to the constitution in FIGS. 3A and 3B. After a time when the key-on signal KON becomes "1" signal, an envelope generator 176 successively outputs envelope data ED to a multiplier 177. The envelope data ED are determined in correspondence with the key code KC, the tone code TC and the touch data TD. A waveform of the key-on signal KON is shown in FIG. 9(A), and waveforms corresponding to two types of envelope data ED are respectively shown in FIG. 9(B) and FIG. 9(C), for example. Concretely, FIG. 9(B) shows a tone of a percussive system and FIG. 9(C) shows a tone of a continuous type. The multiplier 177 multiplies the decoded data $H(n)$ outputted from the decoding circuit 163 by the envelope data ED. An output data of the multiplier 177 is supplied to a D/A converter (a digital-to-analog converter) 178 where the output data are converted into an analog signal. This analog signal is amplified in a sound system 179 and is thereafter outputted as a sound by a speaker.

Next, description will be given with respect to the practical operation of the second embodiment shown in FIGS. 3A and 3B. First, when a player manipulates the tone-color selection operating elements to select a certain tone-color, the tone code TC is outputted from the tone-color selecting circuit 142 in correspondence with the selected tone-color and is supplied to predetermined portions of the instrument. Next, when the player depresses a selected key of the keyboard 136, the touch detecting circuit 137 outputs the touch data TD, the key-depression detecting circuit 138 outputs the key-on pulse KONP, the key-on signal KON ("1" signal) and the key code KC. The flip-flop 146, the frame counter 157 and the D-FF 170 and 171 (shown in FIG. 8) are simultaneously reset when the key-depression detecting circuit 138 outputs the key-on pulse KONP. When the frame counter 157 is reset, the value of the frame code FLC outputted from the frame counter 157 becomes "0". This frame code FLC of "0" is supplied to the frame end address memory 159 and the linear predictive coefficient memory 161. Thus, the frame end address FLEA(0) is outputted from the frame end address memory 159, and the linear predictive coefficients $a_1$ and $a_2$ for the frame[0] are outputted from the linear predictive coefficient memory 161. In addition, the above-mentioned key-on pulse KONP is supplied to the address counter 140 via an OR gate 184, so that the address counter 140 is reset. Furthermore, the key-on pulse KONP is supplied to the selector 202 shown in FIG. 8A. Hence, the initial value $d(n_0)$ outputted from the initial value memory portion 203 is passed through the selector 202 and the max/min control portion 204 in series, and the initial value $d(n_0)$ is supplied to the decoder 210 where the initial value $d(n_0)$ is latched therein.

The envelope generator 176 sequentially outputs the envelope data ED after a time when the key-depression detecting circuit 138 outputs the key-on signal KON. In addition, the note clock generating circuit 139 outputs the note clock NCK to the address counter 140 after a time when the key-depression detecting circuit 138 outputs the key code KC to the note clock generating circuit 139. This note clock NCK has a frequency corresponding to a tone pitch of the depressed key. The address counter 140 counts up this note clock NCK. Thus, the count value outputted from the address counter 140 will be changed as 0, 1, 2, .... The count value from the address counter 140 is supplied to the adder 141 where the count value is added to the output value of the selector 145. At this time, the flip-flop 146 has been reset, therefore, the selector 145 outputs the start address data SA outputted from the address memory 143. As a result, the output data of the adder 141 become the sum data of the above start address data SA and the count data from the address counter 140, and the sum data is outputted to the data memory 135 as the address data AD. More specifically, address data AD such as "SA+0", "SA+1", "SA+2", ... are successively supplied to the data memory 135. Thus, the data memory 135 successively outputs the quantized difference code C(n) of the attack portion ATC to the decoding circuit 163.

The decoding circuit 163 first decodes the quantized difference code C(n) to the data "E(n)+e$_r$(n)" and then decqdes the data "E(n)+e$_r$(n)" to the data H(n). More specifically, when the data memory 135 starts to successively output the quantized difference code C(n), a repeat end signal REND is the "0" signal. In addition, the key-on pulse KONP is turned to the "1" signal only when the key is depressed, and thereafter, the key-on pulse KONP is immediately turned to the "0" signal. Therefore, after a time when the key is depressed, both of the selectors 207 an 217 (shown in FIG. 8A) select input terminals A thereof and output the input data of the input terminals A from the output terminals S thereof. At this time, practical constitution of the ADPCM decoding circuit 124A in FIG. 8A therefore become identical to that of the ADPCM decoding circuit 124 in FIG. 2B. As a result, the ADPCM decoding circuit 124A decodes the quantized difference data C(n) outputted from the data memory 135 as same as the case of FIG. 2B, and the ADPCM decoding circuit 124A outputs the decoded data "E(n)+e$_r$(n)" to the linear prediction decoding circuit 129A.

Incidentally, when the key is depressed, the key-on pulse KONP becomes the "1" signal, so that the output value of the gate 216 becomes "0". This "0" data is supplied to the adder 211 via the selector 217. As a result, the adder 211 outputs the data "e(n)+e$_r$(n)" as the data "E(n)+e$_r$(n)".

The linear prediction decoding circuit 129A decodes the data "E(n)+e$_r$(n)" to the decoded data "H(n)=S(n)+e$_r$(n)". When the key-on signal KON rises, the repeat end signal REND is the "0" signal, so that the selectors 168 and 169 (shown in FIG. 8B) output the input data of the input terminals B from the output terminals thereof. In this case, both constitutions of the linear prediction decoding circuit 129A shown in FIG. 8B and the linear prediction decoding circuit 129 shown in FIG. 2B become the same. Therefore, the data "E(n)+e$_r$(n)" outputted from the adder 211 will be decoded in a manner described above for the linear prediction decoding circuit 129, and the decoded data H(n) will be obtained.

Referring again to FIG. 3B, the envelope is added to the decoded data H(n) in the multiplier 177, and the output data of the multiplier 177 is converted into an analog signal in the D/A converter 178. Thereafter, the analog signal is supplied to the sound system 179 where the analog signal is outputted as a musical tone. Thus, the musical tone is generated with respect to the frame [0].

Next, when the address data AD have reached to the frame end address FLEA(0), the "1" signal is outputted from the comparator 160 and is supplied to the clock terminal CK of the frame counter 157 via the D-FF 158. Hence, the frame counter 157 is subjected to an increment and the frame code FLC is turned to "1". At this time, the frame end address FLEA(1) is outputted from the frame end address memory 159. In addition, the linear predictive coefficients a$_1$ and a$_2$ of the frame [1]are outputted from the linear predictive coefficient memory 161 and are supplied to the multipliers 172 and 173 (shown in FIG. 8B).

Thereafter, the data memory 135 reads out the stored data continuously and the musical tone of the frame [1]is generated. As described before, when the address data AD have reached to the frame end address FLEA(1), the frame end address FLEA(2) is outputted from the frame end address memory 159, and the linear predictive coefficients a$_1$ and a$_2$ are outputted from the linear predictive coefficient memory 161 as well. Thus, the musical tone is generated with respect to the frame [2].

For example, when the address data AD become identical to the attack end address AEA (shown in FIG. 4) in the middle of an operation for generating the musical tone of the frame [2], the attack end signal AEND is outputted from the comparator 148 and is supplied to load terminals L of the latch circuits 206 and 218 (shown in FIG. 8A). As a result, the latch circuit 206 memorizes the quantization range data d(n) corresponding to the last data of the attack portion ATC, and the latch circuit 218 memorizes the last data "E(n)+e$_r$(n)" of the attack portion ATC.

Figures 10, 11:
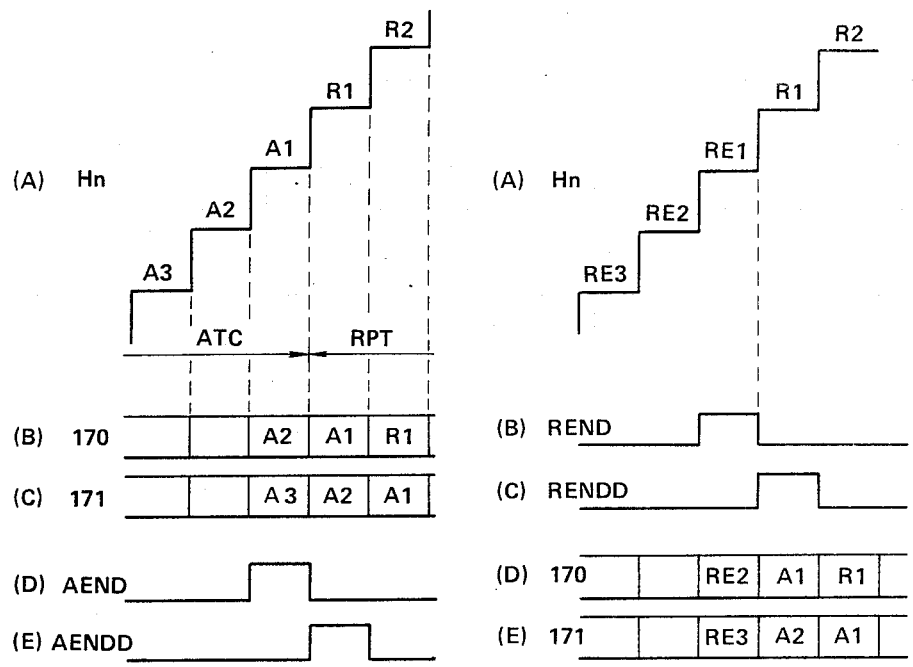
FIG. 10 is a timing chart for explaining a connection between an attack portion ATC and a repeat portion RPT.
FIG. 11 is a time chart for explaining a connection between an ending part of a first repeat portion RPT and a starting part of a second repeat portion RPT.

In addition, the signal AENDD is outputted from the D-FF 149 shown in FIG. 3A after a time when the one clock period is passed after the attack end signal AEND is generated. The signal AENDD is supplied to the address counter 140 via the OR gates 186 and 184 so that the address counter 140 is reset. Furthermore, the signal AENDD is supplied to a set terminal S of the flip-flop 146 so that the flip-flop 146 is set. After that, the repeat address RA is supplied to the adder 141 via the selector 145. The signal AENDD is also supplied to the load terminals L of the latch circuit 166 and 167 (shown in FIG. 8B) so that output data of the D-FF 170 and 171 thereat are read respectively into the latch circuit 166 and 167. FIG. 10(A) shows examples of the last data H(n) of the attack portion ATC and the first data H(n) of the repeat portion RPT both outputted from the adder 165 in FIG. 8B. FIG. 10(B) and FIG. 10(C) respectively show the output data of the D-FF 170 and 171. And, the signals AEND and AENDD are respectively outputted as shown in FIG. 10(D) and FIG. 10(E). As is apparent from FIG. 10, when the signal AENDD is supplied to the load terminals L of the latch circuits 166 and 167, the latch circuit 166 memorizes the last data (A1) of the attack portion ATC and the latch circuit 167 memorizes the data (A2) second to the last.

The above is a description with respect to an operation based on the signal AENDD. Thereafter, the adder 141 outputs the address data AD in a sequence of "RA+0", "RA+1", "RA+2", "RA+3", ... , and the musical tone of the repeat portion RPT will be generated thereby. As is the same to the operation for generating the musical tone of the attack portion ATC, the new linear predictive coefficients a$_1$ and a$_2$ are outputted from the linear predictive coefficient memory 161 by each frame and are supplied to the decoding circuit 163.

Next, when the address data AD becomes identical to the repeat end address REA, that is to say, when the musical tone is generated with respect to the repeat portion RPT at the first time, the repeat end signal REND ("1" signal) is outputted from the comparator 152 and is supplied to the D-FF 153 and the selectors 168 and 169 (shown in FIG. 8B) as well. At this time, the selectors 168 and 169 select the input terminals A thereof, and the output data of the latch circuits 166 and 167 are supplied respectively to the input terminals of the D-FF 170 and 171 via the selectors 168 and 169. Next, when the note clock NCK is outputted, the D-FF 170 and 171 read in the output data of the latch circuits 166 and 167, and the D-FF 153 (FIG. 3A) outputs the signal RENDD ("1" signal). The signal RENDD is supplied to a preset terminal PR of the frame counter 157, whereby the frame counter 157 presets the output value ( "2", for example) of the repeat frame memory 156. As a result, the frame code FLC becomes "2" and the frame end address memory 159 outputs the frame end address FLEA(2). In addition, the linear predictive coefficient memory 161 outputs the linear predictive coefficients $a_1$ and $a_2$ of the frame [2]. The signal RENDD is supplied to the selectors 207 and 217 shown in FIG. 8A so that the selectors 207 and 217 select the input terminals B thereof. At this time, the output data of the latch circuits 206 and 218 are outputted via the selectors 207 and 217. Therefore, when the first quantized difference code C(n) is read out in the second cycle for generating the musical tone by use of the repeat portion RPT, the quantization range data $d(n-1)$ and the PCM reproduction code $pE(n-1)$ referred to as the preceding values are those which correspond to the last quantization range code C(n) of the attack portion ATC. Therefore, the data is processed as if the repeat portion RPT for this second cycle follows the attack portion ATC in the continuous manner, so that the smooth musical tone will be obtained.

The signal RENDD is supplied to the address counter 140 via the OR gates 186 and 184 so that the address counter 140 is reset. Hence, the adder 141 repeats to output the address data AD in a sequence of "RA+0", "RA+1", "RA+2", ... so that the second cycle of generation of the musical tone of the repeat portion RPT is performed. Of course, the linear predictive coefficients $a_1$ and $a_2$ will be also changed by each frame.

Next, description will be given with respect to the decoded data H(n) of the head portion of the second repeat portion RPT. As shown in FIG. 11(A), the decoded data H(n) of the last portion of the repeat portion RPT are represented by RE3, RE2 and RE1. FIG. 11(B) and FIG. 11(C) respectively show the repeat end signal REND and the signal RENDD. The latch circuits 166 and 167 memorize the data A1 and A2 (the decoded data of the last portion of the attack portion ATC) as described in FIG. 10. As shown in FIG. 11(D) and FIG. 11(E), the D-FF 170 and 171 respectively read in the data A1 and A2 at a leading edge of the signal RENDD. At the same time, the first quantized difference code C(n) of the repeat portion RPT is read from the data memory 135. More specifically, when the first quantized difference code C(n) of the repeat portion RPT is read from the data memory in the second cycle, the data in the D-FF 170 and 171 become identical to those in the first cycle. Hence, the linear prediction decoding circuit 129A outputs the decoded data which is identical to that in the first reproduction cycle. Similarly, the second decoded data H(n), the third decoded data H(n) and other decoded data H(n) will be obtained in the second reproduction cycle of the repeat portion RPT as well.

Thus, the second repeat portion of the musical tone is generated by use of the repeat portion RPT, thereafter, the third, fourth, ... last portion of the musical tones will be generated by use of the repeat portion RPT under the same process described above.

When the player takes his finger off the key, the key-on signal KON is returned to the "0" signal. Hence, the value of the envelope data ED are gradually attenuated to "0", and the generated musical tone becomes attenuated and finally ceases.

Figure 12:
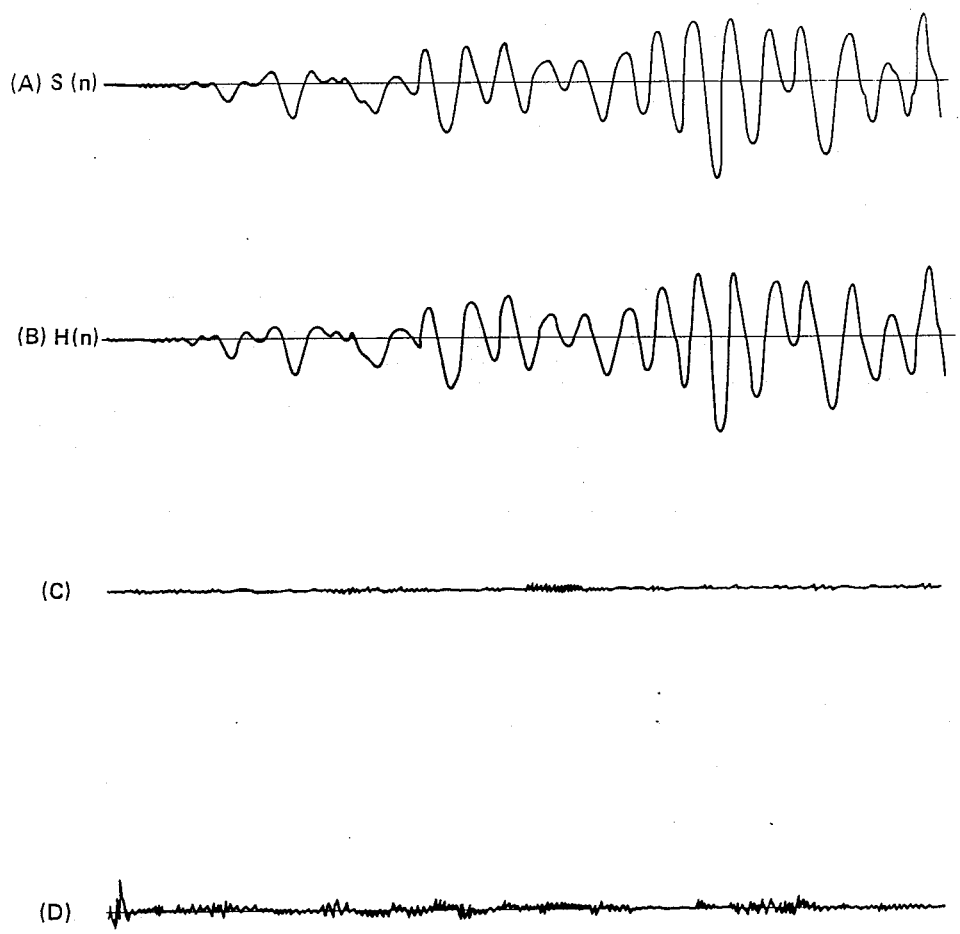
FIG. 12 is a graph of experiment results obtained by use of the first embodiment shown in FIG. 2.

Next, description will be given with respect to the experiment result obtained by practicing the above embodiments in conjunction with FIG. 12. FIG. 12(A) shows a waveform of the original data S(n) obtained by sampling a piano tone. Each data S(n) shown in FIG. 12(A) is converted into the quantized difference code C(n) in the data compressing circuit 101 shown in FIG. 2, and the code C(n) is stored in a memory. The stored code C(n) is read from the memory and is decoded into the data H(n) in the circuit shown in FIGS. 8A and 8B. FIG. 12(B) shows the waveform of this decoded data H(n). FIG. 12(C) shows the subtraction result obtained by subtracting the data H(n) shown in FIG. 12(B) from the data S(n) shown in FIG. 12(A), in other words, FIG. 12(C) shows the reproduction error. In FIG. 12(C), the scale of the vertical line is four times that in the FIG. 12(A) and FIG. 12(B).

As shown in FIG. 12(C), although the data are greatly compressed and are stored in the memory in the above embodiments, it is possible to reproduce the stored data with extremely small error.

In the above embodiments, the degree of the linear prediction operation, i. e., the number of D-FF 114$a$ and 114$b$ is secondary, however, it is not limited to that. Due to the experiment results, the reproduction error become the smallest when employing the secondary linear prediction operation. For example, FIG. 12(D) shows the reproduction error when the fourth linear prediction operation is employed wherein the other experimental conditions are the same as those in FIG. 12(A) through FIG. 12(C). In FIG. 12(D), the reproduction error is larger than that in FIG. 12(C) because a correlation between the data E(n) becomes less as the accuracy of the linear prediction operation becomes better. As a result, a compression rate (or a compression accuracy) of the ADPCM operating circuit becomes lower. On the other hand, the correlation between the data E(n) is remained to a certain extent in the secondary operation, and therefore, the compression rate of the ADPCM operating circuit becomes better.

Next, description will be given with respect to modified forms of the first and second embodiments in following paragraphs (1) through (18).

Figure 13:
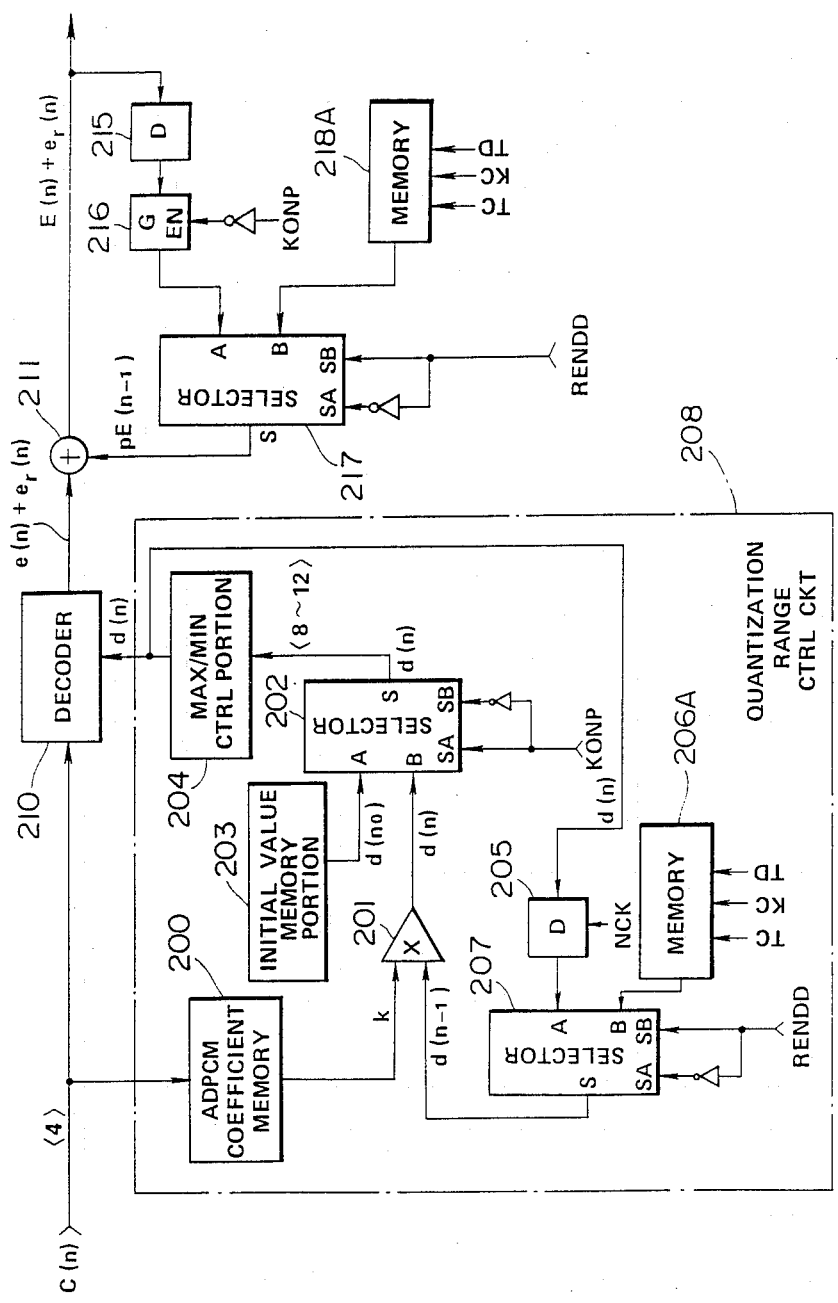
FIG. 13 is a system block diagram showing a modified form of the ADPCM decoding circuit shown in FIG. 8.

(1) FIG. 13 shows a modified form of the ADPCM decoding circuit 124A shown in FIG. 8A. In FIG. 13, a memory 206A for storing data necessary for calculating the initial value of the repeat portion RPT and a memory 218A for storing the value of the last data in the attack portion ATC are provided instead of the latch circuits 206 and 218 shown in FIG. 8A. Therefore, the data are not stored in the latch circuit 206 and 218 by use of the signal AEND, but alternatively, the data for storing are pre-provided in the memories 206A and 218A. Of course, the data must be provided in correspondence with each musical tone waveform stored in the data memory 135

Figure 14:
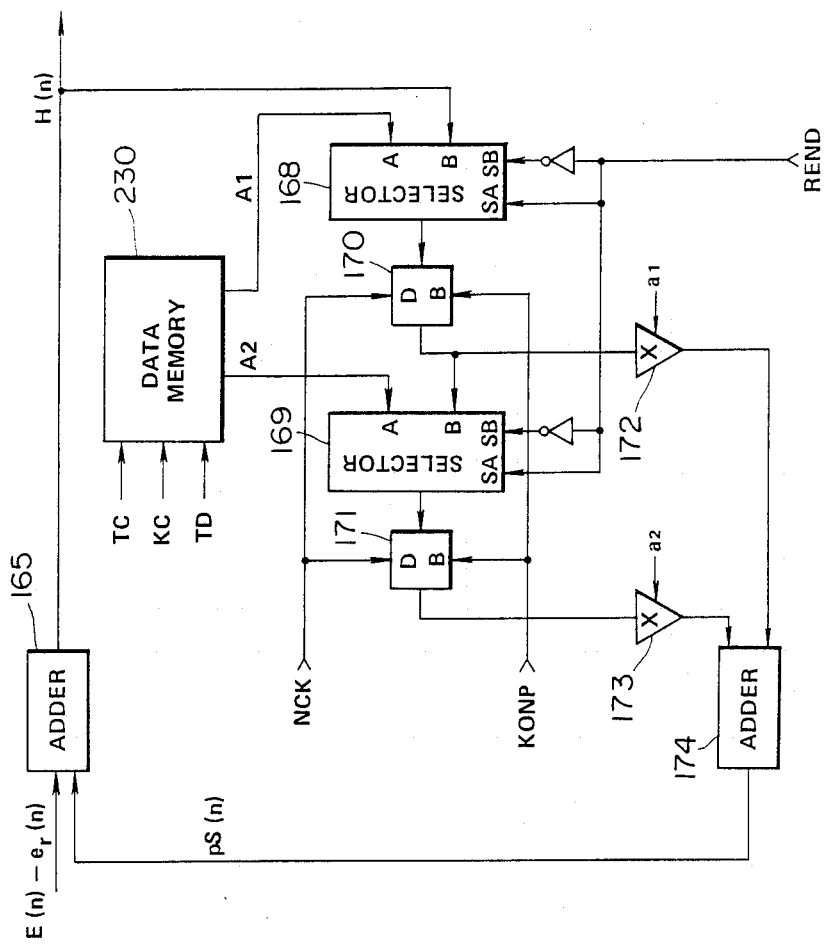
FIG. 14 is a system block diagram showing a modified form of the linear prediction decoding circuit shown in FIG. 8.

FIG. 14 shows a modified form of the linear prediction decoding circuit 129A shown in FIG. 8B. In FIG. 14, a data memory 230 (ROM) for storing data necessary for calculating the initial value of the repeat portion RPT is provided instead of the latch circuits 166 and 167 shown in FIG. 8B. The data memory 230 memorizes the last compressed data A1 and A2 of the attack portion ATC described before in correspondence with each musical tone waveform stored in the data memory 135. When the key code KC, the tone code TC and the touch data TD are supplied to the data memory 230, the data corresponding to the supplied data are read out and are supplied to the selectors 168 and 169.

In FIGS. 13 and 14, the memories 206A, 218A and 230 can be constituted by RAM and the data can be calculated and stored at a power-on time, a tone color selecting time, etc.

In addition, the decoding circuit 163 shown in FIG. 2B can be obtained by properly combining the circuits 124A and 129A shown in FIG. 8, the circuit shown in FIG. 13 and the circuit shown in FIG. 14.

(2) The above embodiments disclose the electronic musical instruments of the monophonic types, however, it is possible to apply the present invention to electronic musical instruments of the polyphonic types. In this case, it is preferred to use the time division process.

(3) It is possible to perform the operation process in the comparators 148, 152 and 160 (FIG. 3A), in the multipliers 172 and 173 (FIG. 8B), etc. based on the time division process.

(4) In the above embodiments, the data memory 135 memorizes the standardized musical tone waveforms, however, it is possible to memorize unstandardized waveforms having envelopes thereof in the memory 135.

(5) Each musical tone waveform is memorized in correspondence with the tone code TC, the key code KC and the touch data TD in the above embodiments, however, it is possible to memorize each waveform in correspondence with the tone code TC only. In addition, the musical tone waveform can be memorized in correspondence with the operating condition of the operating elements manipulated by the player. Any combination of the above methods can be employed in the present invention.

(6) It is possible to employ the interpolation operation instead of memorizing the musical tone waveform for each key code KC and for each touch data TD. In this case, a first waveform corresponding to touch data TD of the strongest touch intensity and a second waveform corresponding to touch data TD of the weakest touch intensity are memorized, for example. And, a certain waveform corresponding to touch data TD having a medium touch intensity can be obtained from the first and second waveforms by performing the interpolation operation. The circuit for performing the interpolation operation has been disclosed in the Japanese Patent Application Laid-Open No.60-55398.

(7) In the above embodiments, only one repeat portion RPT is provided, however, it is possible to provide a plurality of repeat portions RPT. In this case, an interpolation interconnection (as disclosed in U.S. Pat. No. 4,633,749) can be employed for smoothing each interconnection between the repeat portions. Instead of the interpolation interconnection, a waveform connecting method as disclosed in U.S. Pat. No. 4,520,708 can be employed.

(8) In the above embodiments, the digital data outputted from the waveform processing circuit 106 (shown in FIG. 2A) are once stored in the waveform memory 107 and are then compressed. However, it is possible to compress the digital data based on a real time system.

(9) In the above embodiments, the output data of the A/D converter 105 are standardized, and thereafter the output data are compressed. However, it is possible to properly edit the waveform of the output data before compressing the output data. For example, a certain portion is extracted from the waveform, or a certain operation is performed for smoothing the interconnection between the repeat portions.

(10) In the above embodiments, the musical tone is collected by the microphone 104 and is converted into the original musical tone data in the A/D converter 105. However, it is possible to obtain the original musical tone data by use of a computer simulation.

(11) It is possible to constitute the sampling electronic musical instrument by assembling the data compressing circuit, the data memory and the data decoding circuit into one electronic musical instrument.

(12) The application of the present invention is not limited to the keyboard musical instrument. And, it is possible to apply the present invention to other electronic musical instruments having no keyboard, such as a sound source module or a rhythm sound source.

(13) It is possible to provide a (digital) filter connected after the decoding circuit and to control a musical tone by passing the decoded data through the filter. The filter characteristics of the filter are changed according to the touch data TD, the key code KC, etc. to thereby control a tone color of the musical tone.

(14) It is possible to employ methods for generating the address data AD of the data memory 135 other than that described in the above embodiments. Among the methods, there are a method for accumulating a F number(a frequency number), a method for generating the address data by successively subtracting a value from ALL "1", a method for presetting the start address by use of an address counter 140 of the presettable type and a method for calculating the address by use of a (micro) program, for example.

(15) In the above embodiments, the waveform data of the repeat portion RPT is repeatedly read from the memory and the musical tone is generated. However, it is possible to memorize the whole musical tone waveform in the memory and read out the whole waveform to obtain the musical tone.

(16) In the above embodiments, the linear predictive coefficients $a_1$ and $a_2$ are changed by each frame. However, it is possible to use the same linear predictive coefficients $a_1$ and $a_2$ throughout all frames. In this case, it is unnecessary to divide the musical tone waveform into frames.

(17) The method for switching the frames is not limited to that described in the above embodiments. For example, it is possible to switch the frames by use of the upper bits of the address data AD.

(18) In the above embodiments, the frame switching positions and the repeat portion are set independently. However, it is possible to synchronize the frame switching positions with the repeat portion by switching the frames at a head position of the repeat portion, for example.

Figure 15:
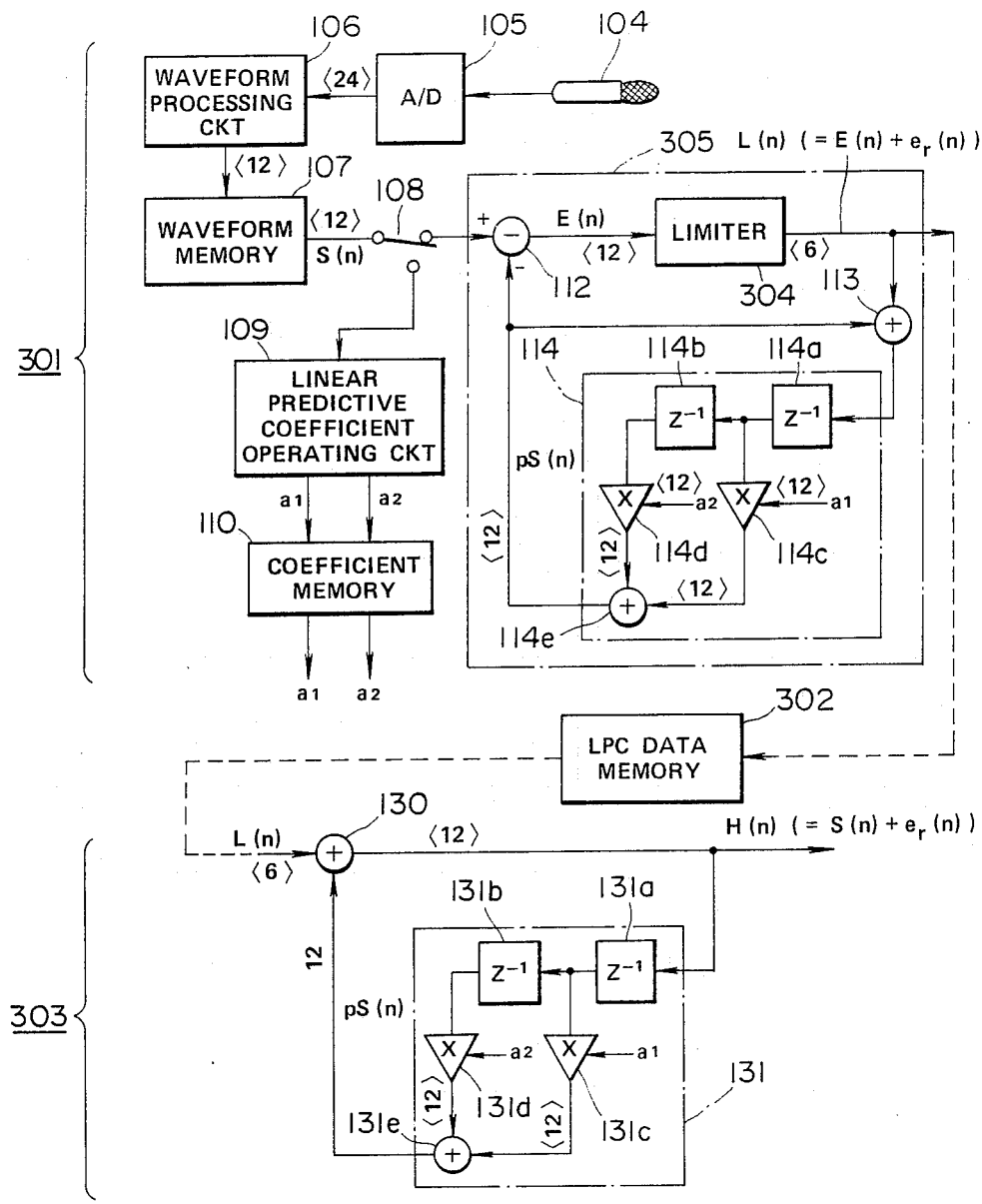
FIG. 15 is a system block diagram of a third embodiment of the invention.

Next, description will be given with respect to the third embodiment of the present invention in conjunction with FIG. 15. In FIG. 15, same numerals designate the corresponding parts shown in FIGS. 2A and 2B, and description thereof will be omitted. The present embodiment is roughly constituted by a data compressing circuit 301, a LPC data memory 302 and a decoding circuit 303. When the circuit shown in FIG. 15 is compared to the circuit shown in FIGS. 2A and 2B, a limiter 304 and the LPC data memory 302 are used respectively instead of the ADPCM operating circuit 116 and the data memory 102 shown in FIG. 2A, and the ADPCM decoding circuit 124 shown in FIG. 2B is omitted. In addition, a linear prediction operating circuit 305 is constituted by the subtractor 112, the adder 113, the prediction value calculating circuit 114 and the limiter 304.

In the linear prediction operating circuit 305, the output data E(n) (of twelve bits) of the subtractor 112 is supplied to the limiter 304. The limiter 304 cuts upper four bits and lower two bits of the output data E(n) of twelve bits to obtain compressed data L(n) of six bits, for example. In the case where the upper four bits of the data E(n) include "1", data whose bits are all "1" is outputted as the compressed data L(n). The compressed data L(n) is thus outputted from the limiter 304 and is stored in the LPC data memory 302. As described before, the value of the data E(n) is further smaller than the value of the waveform data S(n) since the prediction value pS(n) is near the value of the present waveform data S(n). In this case, the upper four bits of the data E(n) are usually "0" except for the initial data. Hence, the data L(n) are approximately identical to the data E(n), and the data L(n) includes only a small error caused by cutting the lower two bits of the data E(n). This data L(n) can be expressed by the following formula (7).

$$L(n) = E(n) + e_r(n) \quad (7)$$

The adder 113 adds the data L(n) to the prediction value pS(n) to obtain the addition result as expressed in the following formula (8).

$$L(n) + pS(n) = E(n) + e_r(n) + pS(n) = S(n) + e_r(n) \quad (8)$$

Hence, the addition result becomes approximately equal to the waveform data S(n), and the prediction value pS(n) is rendered nearly equal to the value of the waveform data S(n) by the prediction value calculating circuit 114, as described before. FIG. 16(A) through FIG. 16(G) show the data S(n), the data E(n), the data L(n), the output data of the adder 113, the output data of the D-FF 114a, the output data of the D-FF 114b and the prediction value pS(n) in correspondence with the waveform data S(1) through S(4). In FIG. 16, the initial values of the D-FF 114a and 114b are set to "0". The data L(n) of six bits is once stored in the LPC memory 302 and is read out to be supplied to the adder 130. As described before, the adder 130 adds the data L(n) of six bits to the data pS(n) of twelve bits to obtain the decoded data H(n) as expressed by the following formula (9).

$$L(n) + pS(n) = E(n) + e_r(n) + pS(n) = S(n-1) + e_r(n) = H(n) \quad (9)$$

FIG. 16(H) through FIG. 16(L) show the output data of the LPC data memory 302, the output data of the adder 130, the output data of the D-FF 131a and 131b, and the output data (the prediction value pS(n)) of the adder 131e. In this case, the initial values of the D-FF 131a and 131b are both set to "0".

Figure 17:
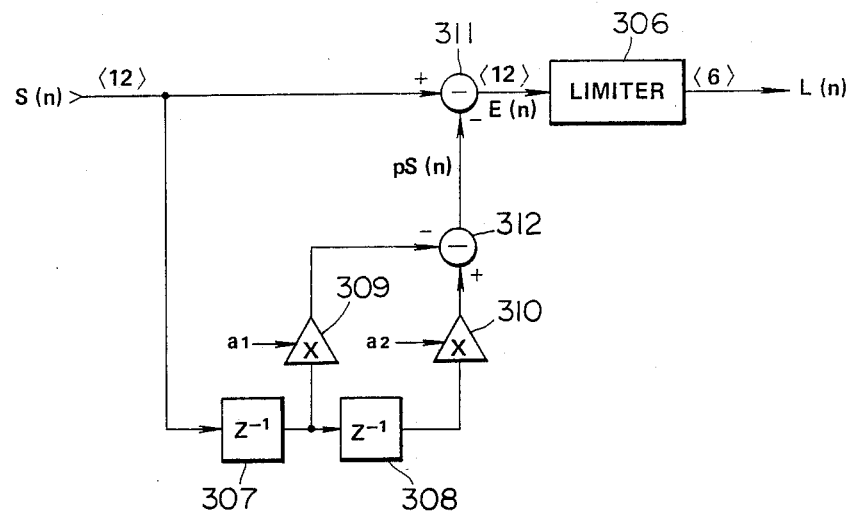
FIG. 17 is a system block diagram showing a modified form of the linear prediction operating circuit shown in FIG. 15.

FIG. 17 shows a modified form of the linear prediction operating circuit 305 shown in FIG. 15. When it is not necessary to consider the error accumulation, this circuit can be employed. In this case, an I/O characteristics of the limiter 306 can be arbitrarily set to optional values, and it is possible to omit the limiter 306 according to the need. In the case where the limiter 306 cuts only the upper bits of the data E(n), the limiter 306 is not required practically.

In FIG. 17, D-FF 307 and 308 and multipliers 309 and 310 are respectively corresponding to the D-FF 114a and 114b and the multipliers 114c and 114d, and description thereof will be omitted. The data S(n) is supplied to the D-FF 307 and a subtractor 311. A subtractor 312 subtracts an output data of the multiplier 309 from the output data of the multiplier 310 to obtain a prediction value pS(n). The subtractor 311 subtracts the above prediction value pS(n) from the data S(n) to obtain the data E(n) of twelve bits. The data E(n) are limited into the data L(n) of six bits in the limiter 306 as well as in the limiter 304.

This invention may be practiced or embodied in still other ways without departing from the spirit or essential character thereof. For instance, in the illustrated preferred embodiments, the main part of the data compression circuit is not limited to the encoders or limiters, and other circuits can be applied for compressing the data. In addition, although the particular embodiments have been described with respect to the use of ADPCM, other modulation methods such as described above in the prior art description may be employed. FIGS. 18–20 illustrate the basic arrangement of an encoder, memory and decoder utilizing DPCM, DM and ADM modulation, respectively. Any of these modulation methods may be employed instead of the ADPCM method specifically described. The preferred embodiments described herein are therefore illustrative and not restrictive, the scope of the invention being indicated by the appended claims and all variations which come within the meaning of the claims are intended to be embraced therein.

What is claimed is:

1. A musical tone generating apparatus for an electronic musical instrument comprising:
   (a) memory means for storing a series of compressed waveform data therein, said series of compressed waveform data being obtained by compressing a series of waveform data representative of instantaneous values of a waveform of a musical tone by use of a predictive coding method and a differential quantization method;
   (b) reading means for reading said series of compressed waveform data from said memory means; and
   (c) decoding means for decoding said read series of compressed waveform data by methods corresponding to said predictive coding method and said differential quantization method to obtain a series of decoded waveform data, said musical tone being reproduced based on said series of decoded waveform data.

2. A musical tone generating apparatus according to claim 1, wherein said decoding means comprises first stage decoding means for decoding said series of compressed waveform data read from said memory means by the method corresponding to said differential quantization method to obtain a series of intermediate decoded data and second stage decoding means for decoding said series of intermediate decoded data by the method corresponding to said predictive coding method to produce said series of decoded waveform data.

3. A musical tone generating apparatus according to claim 1 or claim 2, wherein said predictive coding method employs a secondary predictive coding.

4. A musical tone generating apparatus according to claim 1, wherein said musical tone waveform is divided into an attack portion in which an envelope amplitude thereof becomes increasing and a sustain portion in which an envelope amplitude thereof is generally constant, said memory means storing those compressed waveform data corresponding to said attack portion and those compressed waveform data corresponding to a selected part of said sustain portion, said reading means first reading said compressed waveform data corresponding to said attack portion and then repeatedly reading said compressed waveform data corresponding to said selected part of said sustain portion so that the whole waveform of said musical tone is reproduced from said compressed waveform data stored in said memory means.

5. A musical tone generating apparatus according to claim 1 further comprising sampling means for sampling said musical tone waveform to produce said instantaneous values, encoding means for encoding said instantaneous values by said predictive coding method to produce encoded values, and quantizing means for quantizing said encoded values by said differential quantization method to produce said series of compressed waveform data.

6. A musical tone generating apparatus according to claim 1 further comprising a keyboard, said memory means storing a series of compressed waveform data with respect to each key of said keyboard, said reading means being responsive to depression of each key of said keyboard to read the series of compressed waveform data corresponding to the depressed key from said memory means.

7. A musical tone generating apparatus according to claim 6 further comprising key-depression intensity level detecting means responsive to each depression of key of said keyboard for detecting a level of intensity of said each depression of key to output data representative of the detected intensity level, said series of compressed waveform data corresponding to each key comprising a plurality of groups of compressed waveform data corresponding respectively to predetermined different key-depression intensity levels, said reading means being responsive to said intensity level data to select the series of compressed waveform data corresponding to the depressed key and to read that group of compressed waveform data of said selected series of compressed waveform data which corresponds to the detected intensity level.

8. A musical tone generating apparatus according to claim 1 further comprising tone color selection means for selecting a desired one of a plurality of tone colors to be given to said musical tone to output data representative of the selected tone color, said memory means storing a series of compressed waveform data with respect to each of said plurality of tone colors, said reading means being responsive to said data representative of the selected tone color to read the series of compressed waveform data corresponding to said selected tone color data from said memory means.

9. A musical tone generating apparatus for an electronic musical instrument comprising:
(a) first memory means for storing a group of compressed waveform data divided into a plurality of frames which correspond respectively to a plurality of frames of a waveform of a musical tone represented by said group of compressed waveform data, said group of compressed waveform data being obtained by calculating a predictive coefficient with respect to each frame of said compressed waveform data group and effecting a predictive coding operation on instantaneous values of each frame of said compressed waveform data group using a corresponding one of the calculated predictive coefficients;
(b) second memory means for storing said calculated predictive coefficients;
(c) first reading means for reading said group of compressed waveform data from said first memory means;
(d) second reading means for reading said calculated predictive coefficients in synchronization with the reading of frames of said compressed waveform data group; and
(e) decoding means for decoding the read compressed waveform data group, by effecting a decoding operation corresponding to said predictive coding operation on each frame of said read compressed waveform data group using a respective one of the read predictive coefficients, to thereby obtain a group of decoded waveform data, said musical tone being reproduced from said decoded waveform data.

10. A musical tone generating apparatus according to claim 9, wherein said predictive coding operation is a linear predictive coding operation.

11. A musical tone generating apparatus according to claim 9, wherein said musical tone waveform is divided into an attack portion in which an envelope amplitude thereof becomes increasing and a sustain portion in which an envelope amplitude thereof is generally constant, said first memory means storing those compressed waveform data corresponding to said attack portion and those compressed waveform data corresponding to a selected part of said sustain portion, said first reading means first reading said those compressed waveform data corresponding to said attack portion and then repeatedly reading said those compressed waveform data corresponding to said selected part of said sustain portion so that the whole waveform of said musical tone is reproduced from said compressed waveform data stored in said first memory means.

12. A musical tone generating apparatus according to claim 9 further comprising sampling means for sampling said musical tone waveform to produce said instantaneous values, encoding means for encoding said instantaneous values by said linear predictive coding method to produce said group of compressed waveform data.

13. A musical tone generating apparatus according to claim 9 further comprising a keyboard, said first memory means storing said group of compressed waveform data with respect to each key of said keyboard, said first reading means being responsive to each depressed key of said keyboard to read the group of compressed waveform data corresponding to said each depressed key from said first memory means.

14. A musical tone generating apparatus according to claim 13 further comprising key-depression intensity level detecting means responsive to each depression of key of said keyboard for detecting a level of intensity of said each depression of key to output data representative of the detected intensity level, said group of compressed waveform data corresponding to each key comprising a plurality of blocks of compressed waveform data corresponding respectively to predetermined different key-depression intensity levels, said first reading means being responsive to said intensity level data to select the group of compressed waveform data corresponding to the depressed key and to read that block of compressed waveform data of said selected group of compressed waveform data which corresponds to the detected intensity level.

15. A musical tone generating apparatus according to claim 9 further comprising a tone color selection means for selecting a desired one of a plurality of tone colors to be given to said musical tone to output data representative of the selected tone color, said first memory means storing said group of compressed waveform data with respect to each of said plurality of tone colors, said first reading means being responsive to said data representative of the selected tone color to read the group of compressed waveform data corresponding to said selected tone color data from said first memory means.

16. A musical tone generating apparatus for an electronic musical instrument comprising:
   (a) memory means for storing a series of compressed waveform data therein, said series of compressed waveform data being obtained by compressing a series of waveform data representative of instantaneous values of a waveform of a musical tone by use of either one of a predictive coding method and a modulation method;
   (b) data providing means for providing replacement data;
   (c) reading means for repeatedly reading at least one portion of said series of compressed waveform data from said memory means, said replacement data corresponding to data preceding said at least one portion in time among said series of compressed waveform data;
   (d) circuit means for replacing the first compressed waveform data of said at least one portion with said replacement data to output a group of compressed waveform data; and
   (e) decoding means for decoding said group of compressed waveform data by a decoding method corresponding to said one method to obtain a series of decoded waveform data, said musical tone being reproduced based on said series of decoded waveform data.

17. A musical tone generating apparatus according to claim 16, wherein said modulation method is one of the delta modulation method, the adaptive delta modulation method, the differential modulation method and the adaptive differential modulation method.

18. A musical tone generating apparatus according to claim 16, wherein said musical tone waveform is divided into an attack portion in which an envelope amplitude thereof becomes increasing and a sustain portion in which an envelope amplitude thereof is generally constant, said memory means storing, as said series of compressed waveform data, those compressed waveform data corresponding to said attack portion and those compressed waveform data corresponding to a selected part of said sustain portion, said reading means first reading said those compressed waveform data corresponding to said attack portion and then repeatedly reading, as said at least one portion, said those compressed waveform data corresponding to said selected part of said sustain portion.

19. A musical tone generating apparatus according to claim 18, wherein said data providing means comprises second memory means for storing, as said data, the last compressed waveform data of said those compressed waveform data corresponding to said attack portion.

20. A musical tone generating apparatus according to claim 16 further comprising sampling means for sampling said musical tone waveform to produce said instantaneous values, and encoding means for encoding said instantaneous values by said one method to produce said series of compressed waveform data.

21. A musical tone generating apparatus according to claim 16 further comprising a keyboard, said memory means storing said series of compressed waveform data with respect to each key of said keyboard, said reading means being responsive to each depressed key of said keyboard to read the series of compressed waveform data corresponding to said each depressed key from said memory means.

22. A musical tone generating apparatus according to claim 21 further comprising key-depression intensity level detecting means responsive to each depression of key of said keyboard for detecting a level of intensity of said each depression of key to output data representative of the detected intensity level, said series of compressed waveform data corresponding to each key comprising a plurality of blocks of compressed waveform data corresponding respectively to predetermined different key-depression intensity levels, said reading means being responsive to said intensity level data to select the series of compressed waveform data corresponding to the depressed key and to read that block of compressed waveform data of said selected series of compressed waveform data which corresponds to the detected intensity level.

23. A musical tone generating apparatus according to claim 16 further comprising a tone color selection means for selecting a desired one of a plurality of tone colors to be given to said musical tone to output data representative of the selected tone color, said memory means storing said series of compressed waveform data with respect to each of said plurality of tone colors, said reading means being responsive to said data representative of the selected tone color to read the series of compressed waveform data corresponding to said selected tone color data from said memory means.

24. A waveform data processing system for a musical tone generating apparatus comprising:
   (1) dividing means for dividing a waveform of a musical tone, represented by a series of sample values of an amplitude of said musical tone, into a plurality of frames arranged in terms of time; and
   (2) predictive coefficient calculating means for calculating, with respect to each frame, a predictive coefficient from the sample values of said each frame, each of the calculated predictive coefficients being for use in a predictive operation to be effected on the sample values of a respective one of said plurality of frames to calculate predicted values of said sample values, said predicted values representing an approximated waveform of said waveform and being used to determine compressed waveform data representative of the waveform;
   memory means for storing the compressed waveform data;
   means for designating the pitch of a tone to be generated; and
   reading means for reading out the compressed waveform data at a speed corresponding to the designated pitch.

25. A musical tone generating apparatus for an electronic musical instrument comprising:
   (1) memory means for storing a series of compressed waveform data which have been obtained by compressing a series of waveform data representative of instantaneous values of a waveform of a musical tone by a predictive coding method;

(2) coefficient generating means for generating predictive coefficient data representative of a predictive coefficient of a first predictive operation to be used in said predictive coding method, said predictive coefficient data varying in accordance with a lapse of time; and (3) waveform data reproducing means for reproducing said series of waveform data from said compressed waveform data by effecting a second predictive operation on said compressed waveform data using said predictive coefficient data, said second predictive operation being related with said first predictive operation.

26. A musical tone generating apparatus for an electronic musical instrument comprising:

(1) memory means for storing a series of compressed waveform data which have been obtained by compressing a series of waveform data representative of instantaneous values of a waveform of a musical tone by a predictive coding method;

(2) data providing means for providing replacement data;

(3) reading means for repeatedly reading at least one portion of said series of compressed waveform data from said memory means, said replacement data corresponding to data preceding said at least one portion in time among said series of compressed waveform data;

(4) circuit means for replacing the first compressed waveform data of said at least one portion with said replacement data to output a group of compressed waveform data; and (5) decoding means for decoding said group of compressed waveform data by a decoding method corresponding to said predictive coding method to obtain a series of decoded waveform data, said musical tone being reproduced from said series of decoded waveform data.

27. A musical tone generating apparatus according to claim 26, wherein said predictive coding method uses a linear predictive operation which is effected on said series of waveform data to produce a series of predicted waveform data, said compressed waveform data being obtained from said series of waveform data and said series of predicted waveform data.

28. A musical tone generating apparatus for an electronic musical instrument comprising:

(1) memory means for storing a series of compressed waveform data which have been obtained by compressing a series of waveform data representative of instantaneous values of a waveform of a musical tone by a differential quantization method;

(2) data providing means for providing replacement data;

(3) reading means for repeatedly reading at least one portion of said series of compressed waveform data from said memory means, said replacement data corresponding to data preceding said at least one portion in time among said series of compressed waveform data;

(4) circuit means responsive to said replacement data and said at least one portion for replacing the first compressed waveform data of said at least one portion with said replacement data to output a group of compressed waveform data; and (5) decoding means for decoding said group of compressed waveform data by a decoding method corresponding to said differential quantization method to obtain a series of decoded waveform data, said musical tone being reproduced from said series of decoded waveform data.

29. A musical tone generating apparatus according to claim 28, wherein said differential quantization method uses at least one of the delta modulation operation, the adaptive delta modulation operation, the differential pulse code modulation and the adaptive differential pulse code modulation which is effected on said series of waveform data to produce said compressed waveform data.

30. A waveform data processing system for a musical tone generating apparatus comprising:

(1) approximated waveform data generating means for generating a series of approximated data of a series of waveform data, representative of instantaneous values of a musical tone waveform, by effecting a predictive operation and a differential quantization operation on predetermines ones of said series of waveform data, said series of approximated data representing an approximated waveform of said musical tone waveform;

(2) operation means for effecting a predetermined operation on said series of waveform data and said series of approximated data to produce a series of compressed waveform data; and (3) memory means for storing said compressed waveform data for subsequent readout for generation of musical tones.

31. A waveform data processing system according to claim 30 further comprising sampling means for sampling said waveform of said musical tone to produce said series of waveform data.

32. A waveform data processing system according to claim 30, wherein said predetermined operation is a subtracting operation for subtracting said series of approximated data respectively from said series of waveform data to produce said series of compressed waveform data.

33. A musical tone generating apparatus for an electronic musical instrument comprising:

(1) memory means for storing a series of compressed waveform data which have been obtained by compressing a series of waveform data, representative of instantaneous values of a waveform of a musical tone, by effecting a predictive operation and a differential quantization operation on predetermined ones of said series of waveform data;

(2) reading means for reading said series of compressed waveform data from said memory means; and (3) decoding means for decoding said read series of compressed waveform data by effecting operations corresponding respectively to said predictive operation and said differential quantization operation on said read series of compressed waveform data to obtain a series of decoded waveform data, said musical tone being reproduced from said series of decoded waveform data.

34. A musical tone generating apparatus according to claim 33 further comprising sampling means for sampling said waveform of said musical tone to produce said series of waveform data.

35. A musical tone generating apparatus according to claim 33 further including subtracting operation means for subtracting a series of approximated data, which represent approximated version of said series of waveform data, obtained by said predictive operation and said differential quantization operation respectively from said series of waveform data to produce said series of compressed waveform data.

36. A waveform data processing system for a musical tone generating apparatus comprising:
   (1) approximated waveform data generating means for generating a series of approximated data of a series of waveform data, representative of instantaneous values of a waveform relating to a musical tone, by effecting a predictive operation and a differential quantization operation on a predetermined ones of said series of waveform data, said series of approximated data representing an approximated waveform of said musical tone waveform;
   (2) operation means for effecting a predetermined operation on said series of waveform data and said series of approximated data to produce a series of compressed waveform data;
   (3) memory means for storing said series of compressed waveform data;
   (4) reading means for reading said series of compressed waveform data from said memory means; and
   (5) decoding means for decoding said read series of compressed waveform data by effecting operations corresponding respectively to said predictive operation and said differential quantization operation on said read series of compressed waveform data to obtain a series of decoded waveform data, said musical tone being reproduced from said series of decoded waveform data.

37. A musical tone generating apparatus according to claim 36, wherein said operation means includes subtracting operation means for subtracting said series of approximated data respectively from said series of waveform data to produce said series of compressed waveform data.

38. A musical tone generating apparatus for an electronic musical instrument comprising:
   (1) operation means for performing an operation on a series of waveform data representative of instantaneous values of a waveform of a musical tone and a series of predicted data of said series of waveform data to output a series of operated waveform data;
   (2) first processing means having first compressing means for compressing said series of operated waveform data to output a series of first compressed waveform data and first reproducing means for reproducing said series of operated waveform data by performing an inverse operation of said first compressing means on said series of first compressed waveform data; and
   (3) second processing means having second compressing means for compressing said first compressed waveform data to produce a series of second compressed waveform data for determining said series of predicted data.

39. A musical tone generating apparatus according to claim 38 further comprising sampling means for sampling said waveform of said musical tone to produce said series of waveform data.

40. A musical tone generating apparatus according to claim 38 further comprising:
   memory means for storing said series of second compressed waveform data;
   reading means for reading said series of second compressed waveform data from said memory means; and
   tone reproducing means for reproducing said series of waveform data by effecting operations inversely corresponding to those effected by said first compressing means and said second compressing means on said read series of second compressed waveform data to obtain a series of tone reproducing waveform data, said musical tone being reproduced from said series of tone reproducing waveform data.

41. A musical tone generating apparatus according to claim 38, wherein the operation performed by said operation means is a subtracting operation for subtracting said series of predicted data of said series of waveform data respectively from said series of waveform data to produce said series of operated waveform data.

* * * * *